US 8,530,850 B2

(12) United States Patent
Spartiotis et al.

(10) Patent No.: US 8,530,850 B2
(45) Date of Patent: Sep. 10, 2013

(54) HIGH ENERGY, REAL TIME CAPABLE, DIRECT RADIATION CONVERSION X-RAY IMAGING SYSTEM FOR CD-TE AND CD-ZN-TE BASED CAMERAS

(75) Inventors: Konstantinos Spartiotis, Espoo (FI); Tuomas Pantsar, Espoo (FI)

(73) Assignee: Oy AJAT Ltd, Espoo (FI)

(*) Notice: Subject to any disclaimer, the term of this patent is extended or adjusted under 35 U.S.C. 154(b) by 1045 days.

(21) Appl. No.: 11/226,877

(22) Filed: Sep. 14, 2005

(65) Prior Publication Data

US 2006/0071174 A1 Apr. 6, 2006

Related U.S. Application Data

(63) Continuation-in-part of application No. 11/017,629, filed on Dec. 20, 2004, now abandoned.

(60) Provisional application No. 60/585,742, filed on Jul. 6, 2004.

(30) Foreign Application Priority Data

Jul. 1, 2005 (WO) .................. PCT/IB2005/001896

(51) Int. Cl.
*G01T 1/24* (2006.01)

(52) U.S. Cl.
USPC ............. 250/370.13; 250/370.08; 250/370.12

(58) Field of Classification Search
USPC ..................... 250/370.13, 370.08, 370.12
See application file for complete search history.

(56) References Cited

U.S. PATENT DOCUMENTS 4,135,247 A * 1/1979 Gordon et al. .................. 378/11
5,120,950 A 6/1992 Roziere et al.

(Continued)

FOREIGN PATENT DOCUMENTS

| EP | 0 904 655 | | 3/1999 |
| EP | 1 267 411 | | 12/2002 |
| EP | 1 267 411 | A2 | 12/2002 |
| JP | 7072252 | A | 3/1995 |
| JP | 10098651 | A | 4/1998 |
| JP | 11307756 | A | 11/1999 |
| JP | 2003066149 | A | 3/2003 |
| JP | 2003156565 | A | 5/2003 |
| WO | 03008999 | A2 | 1/2003 |

OTHER PUBLICATIONS

Spartiotis K et al., "A directly converting high-resolution intra-oral X-ray imaging sensor", Nuclear instruments & methods in physics research, vol. 501, No. 2-3, Apr. 1, 2003, pp. 594-601.
Spartiotis K et al., "A CdTe real time X-ray imaging sensor and system", Nuclear instruments & methods in physics research, vol. 527, No. 3, Jul. 21, 2004, pp. 478-486.
Japanese Office Action, dated Jun. 29, 2010, from corresponding JP application.

*Primary Examiner* — David Porta
*Assistant Examiner* — Shun Lee
(74) *Attorney, Agent, or Firm* — Young & Thompson

(57) ABSTRACT

A calibrated real-time, high energy X-ray imaging system is disclosed which incorporates a direct radiation conversion, X-ray imaging camera and a high speed image processing module. The high energy imaging camera utilizes a Cd—Te or a Cd—Zn—Te direct conversion detector substrate. The image processor includes a software driven calibration module that uses an algorithm to analyze time dependent raw digital pixel data to provide a time related series of correction factors for each pixel in an image frame. Additionally, the image processor includes a high speed image frame processing module capable of generating image frames at frame readout rates of greater than ten frames per second to over 100 frames per second. The image processor can provide normalized image frames in real-time or can accumulate static frame data for substantially very long periods of time without the typical concomitant degradation of the signal-to-noise ratio.

23 Claims, 19 Drawing Sheets

(56) References Cited

U.S. PATENT DOCUMENTS

| | | | |
|---|---|---|---|
| 5,379,336 A | 1/1995 | Kramer et al. | |
| 5,812,191 A | 9/1998 | Orava et al. | |
| 6,246,746 B1 * | 6/2001 | Conrads et al. | 378/98.7 |
| 6,278,765 B1 * | 8/2001 | Berliner | 378/98.12 |
| 6,600,160 B2 | 7/2003 | Kobayashi et al. | |
| 2003/0038242 A1 * | 2/2003 | Endo | 250/370.14 |
| 2003/0142792 A1 | 7/2003 | Schmidt et al. | |
| 2003/0155516 A1 | 8/2003 | Spartiotis et al. | |
| 2003/0173523 A1 | 9/2003 | Vuorela | |
| 2003/0215056 A1 | 11/2003 | Vuorela | |
| 2004/0094720 A1 * | 5/2004 | Dagan et al. | 250/370.12 |
| 2004/0101091 A1 * | 5/2004 | Rosner et al. | 378/19 |

\* cited by examiner

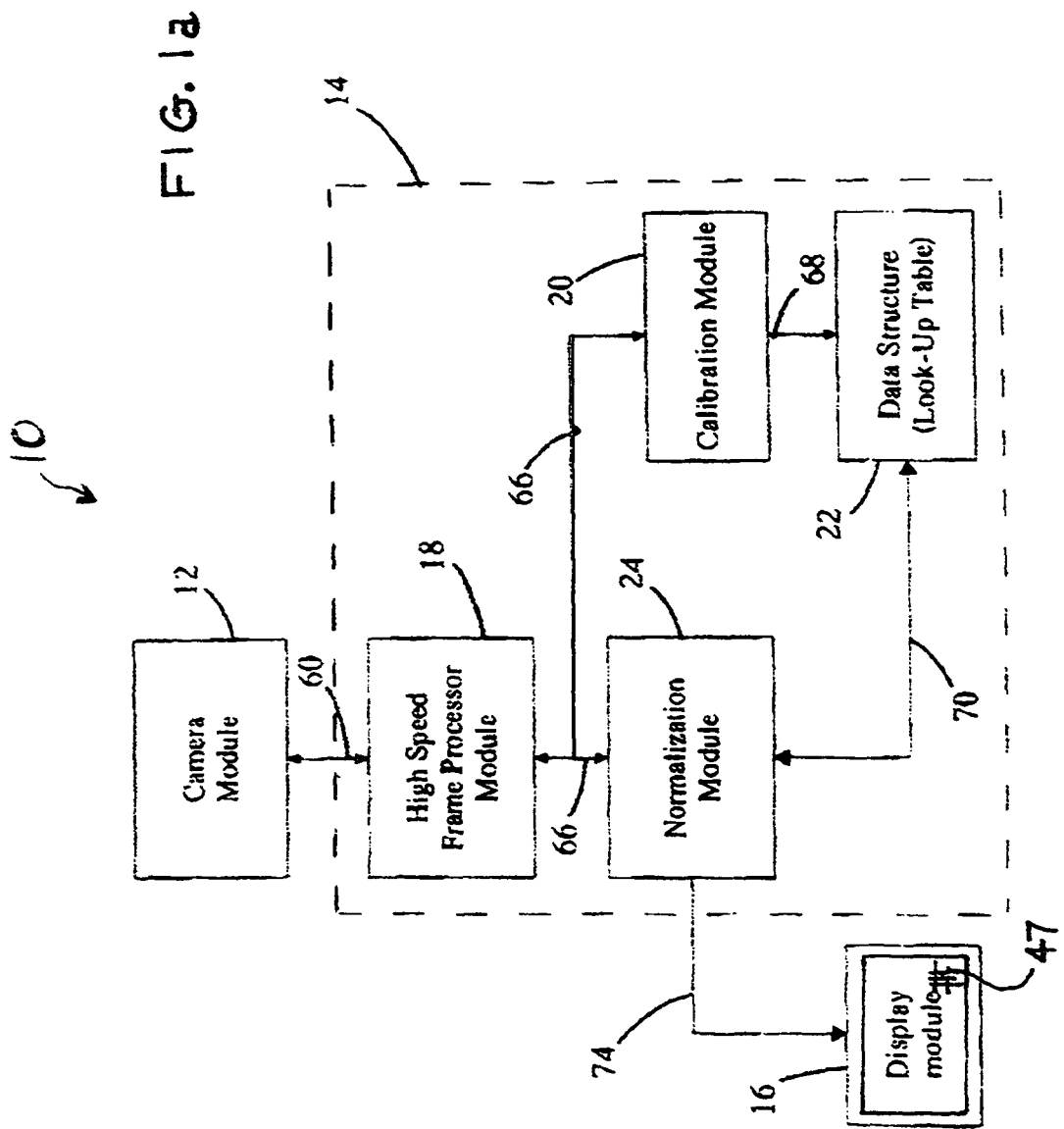

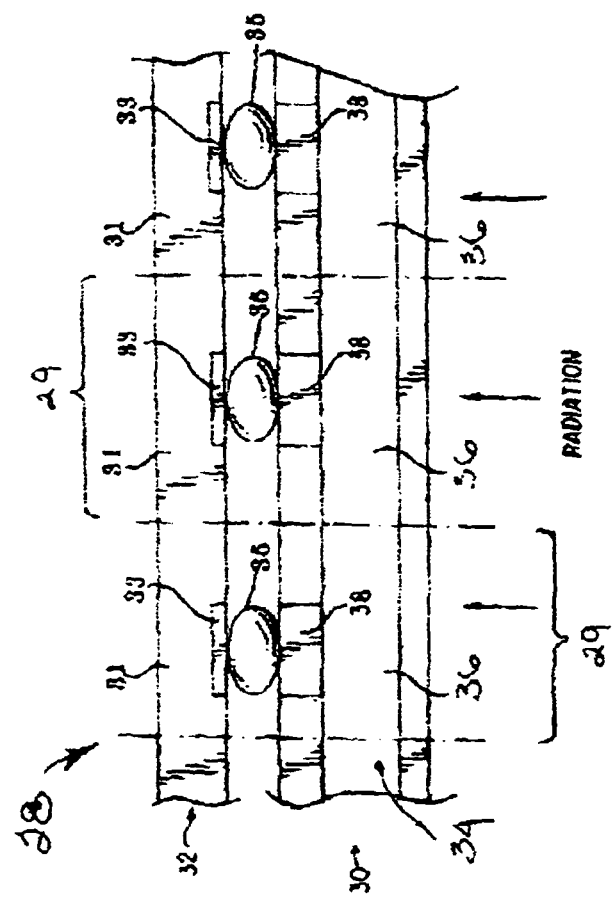

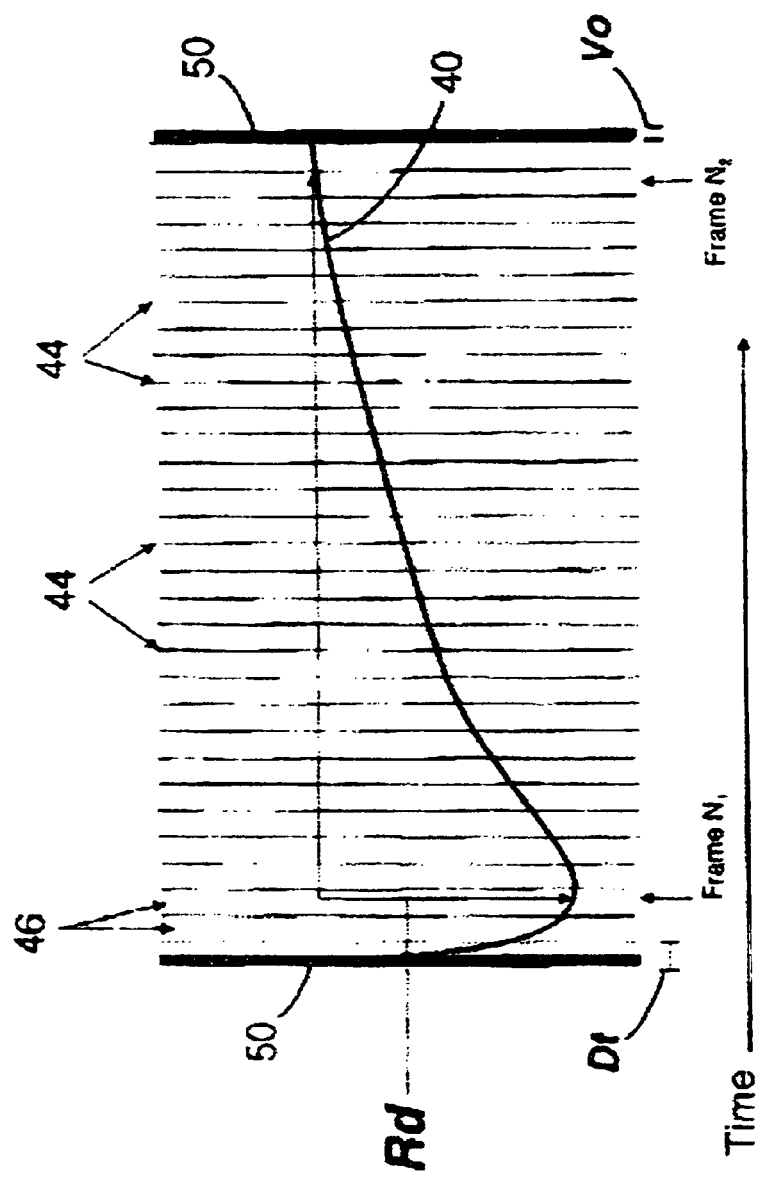

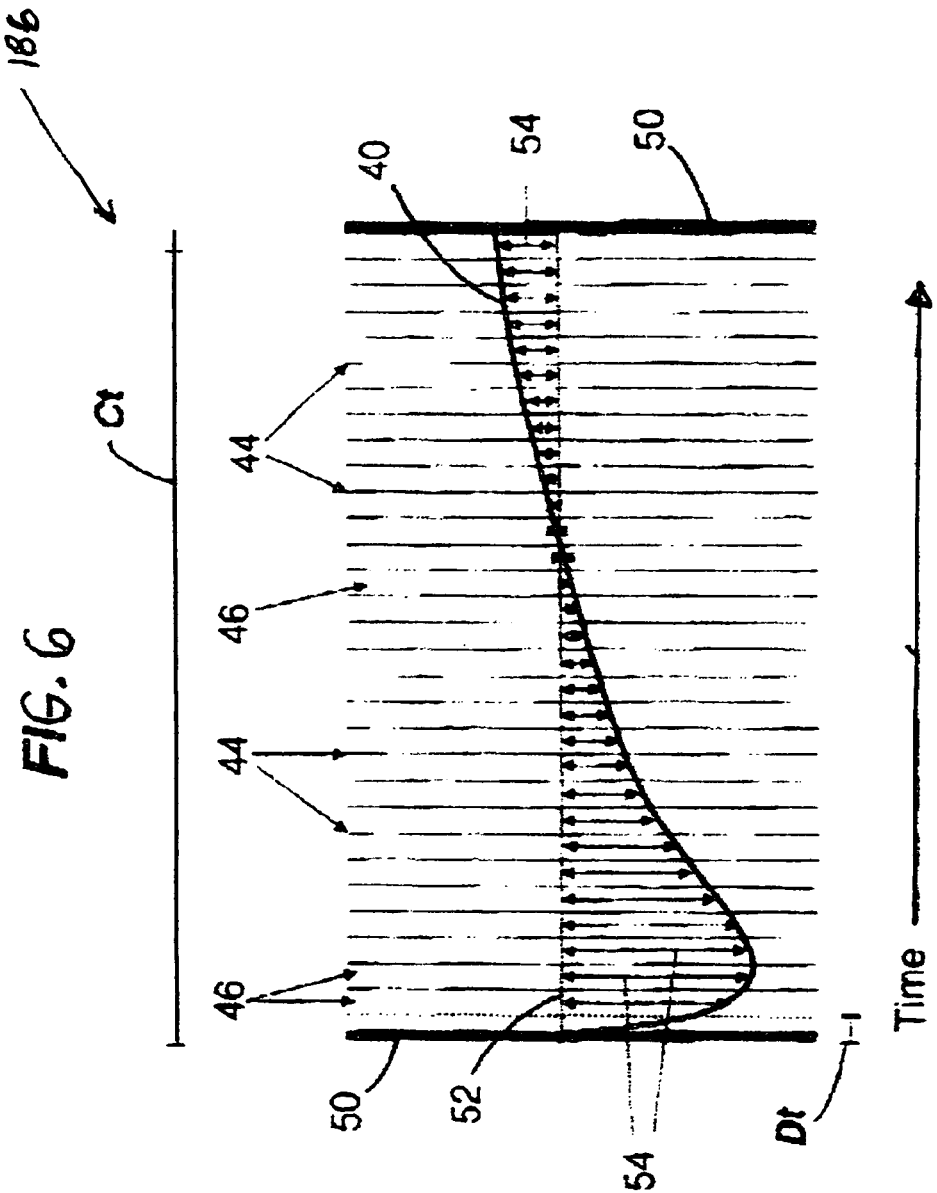

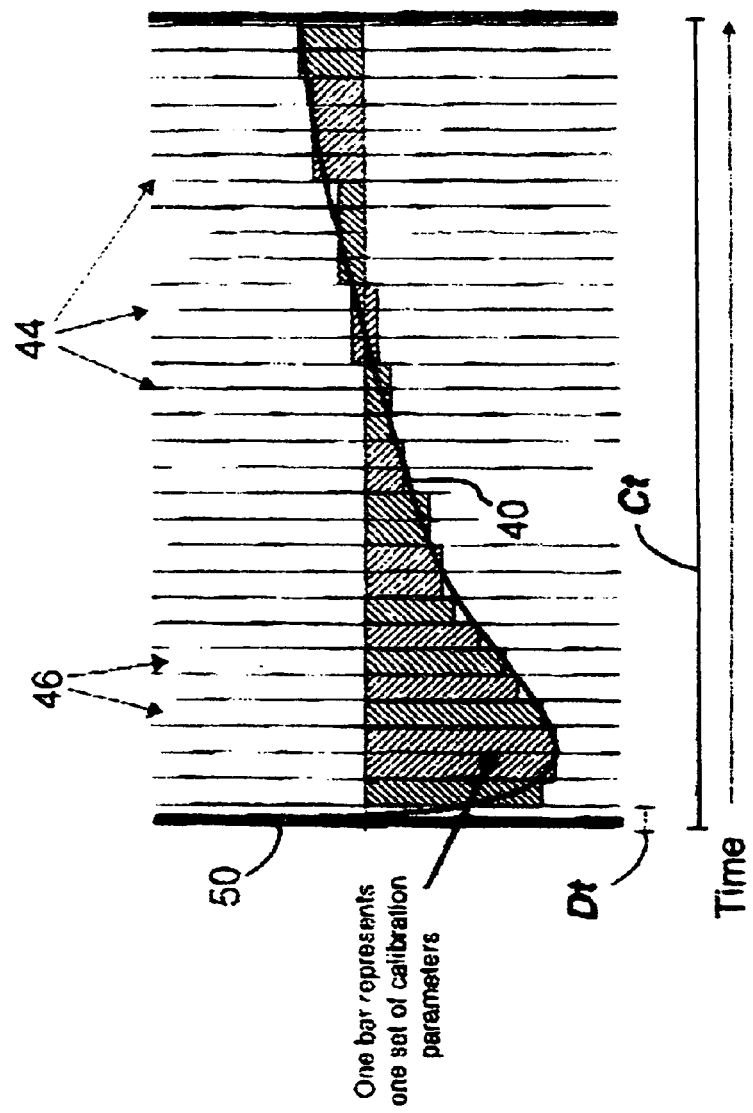

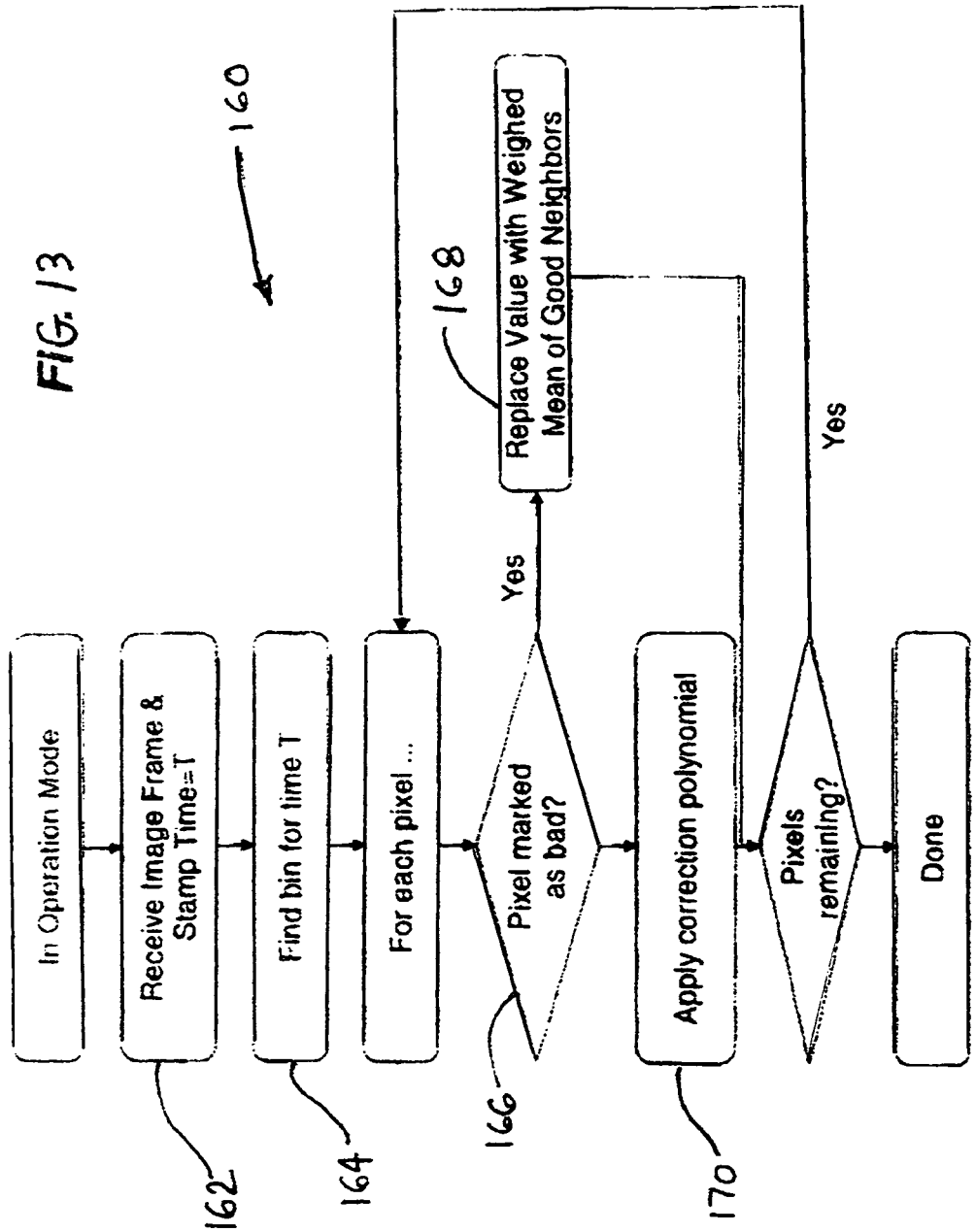

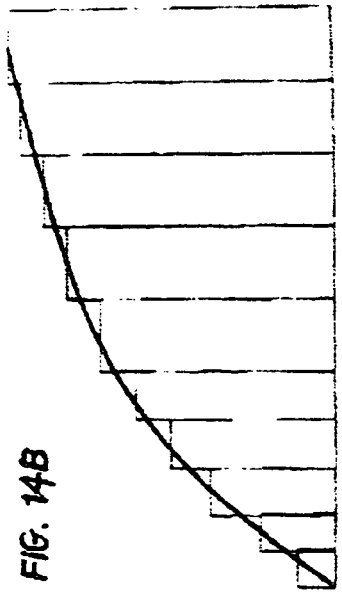

FIG. 14A (Prior Art)

Traditional: Uniform sampling
300 fps, 30 sec cycle, 100,000 pixels, 4 parameters, 4 bytes / parameter
=> 13 GB of data => impractical
3rd Order polynomial for signal, 0th order for time

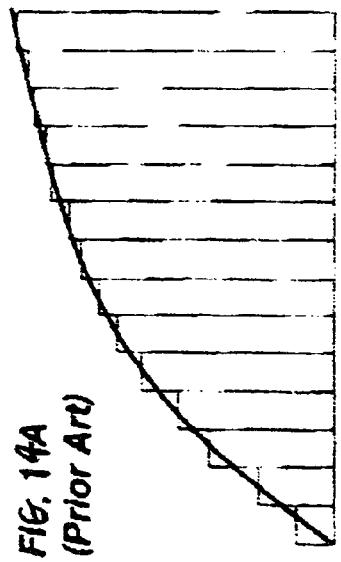

FIG. 14C

Present Invention. Non-uniform sampling, linear interpolation
10 datasets, 4 parameters => 18 MB, reduction factor 900 from the original!
Smaller artifacts in the beginning and at the end of the cycle.
Bilinear correction: linear for signal and linear for time!
Linear interpolation in time reduces apparent signal non-linearity and thus linear correction for signal is adequate!

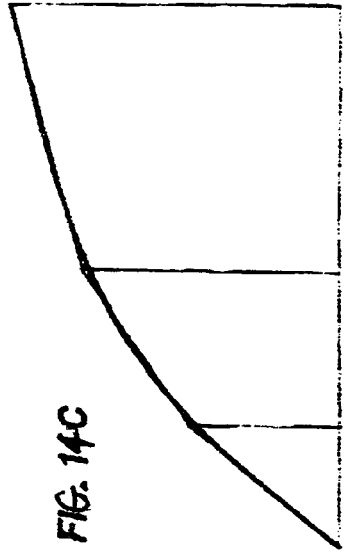

FIG. 14B

Present Invention. Non-uniform sampling, 0-order interpolation
300 datasets, 4 parameters => 480 MB, reduction factor 30
Artifacts in the beginning and at the end of the cycle
3rd Order polynomial for signal, 0th order for time

HIGH ENERGY, REAL TIME CAPABLE, DIRECT RADIATION CONVERSION X-RAY IMAGING SYSTEM FOR CD-TE AND CD-ZN-TE BASED CAMERAS

CROSS REFERENCE TO RELATED APPLICATIONS

The present application is a continuation-in-part application of U.S. Regular application, Ser. No. 11/017,629 filed 20 Dec. 2004 now abandoned, and claims priority to U.S. Provisional Application, Ser. No. 60/585,742, filed 6 Jul. 2004, and PCT Application No. PCT/IB2005/001896, filed on Jul. 1, 2005, the contents of which are incorporated herein by reference thereto.

FIELD OF THE INVENTION

The present invention is in the field of semiconductor imaging systems for imaging x-ray and gamma ray radiant energy. More specifically, the invention relates to a high frame rate, high energy charge-integrating imaging devices utilizing Cd—Te or Cd—Zn—Te based detector substrates in combination with CMOS readout substrates. Additionally, the invention relates to a process for calibrating such high energy radiation imaging systems.

BACKGROUND OF THE INVENTION

Over the past ten years digital radiation imaging has gradually been replacing conventional radiation imaging for certain applications. In conventional radiation imaging applications, the detecting or recording means is a photosensitive film or an analog device such as an Image Intensifier. Digital radiation imaging is performed by converting radiation impinging on the imaging device (or camera) to an electronic signal and subsequently digitizing the electronic signal to produce a digital image.

Digital imaging systems for producing x-ray radiation images currently exist. In some such devices, the impinging or incident radiation is converted locally, within the semiconductor material of the detector, into electrical charge which is then collected at collection contacts/pixels, and then communicated as electronic signals to signal processing circuits. The signal circuits perform various functions, such as analog charge storing, amplification, discrimination and digitization of the electronic signal for use to produce an digital image representation of the impinging radiation's field strength at the imaging device or camera These types of imaging systems are referred to as "direct radiation detection" devices.

In other devices, the impinging radiation is first converted into light in the optical or near optical part of the visible light spectrum. The light is subsequently converted to an electronic signal using photo detector diodes or the like, and the resultant electronic signal is then digitized and used to produce a digital image representation of the impinging radiation's field strength at the imaging device or camera. This type of imaging system is referred to as an "indirect radiation detection" device.

Currently, operation of a flat panel imaging device/camera (of either the direct type or indirect type of detector) typically involves collecting and integrating a pixel's charge over a period of time and outputting the resultant analog signal which is then digitized. Present charge integration times are typically from 100 msec to several seconds. Devices presently available in the field are suitable for single exposure digital x/gamma-ray images, or for slow multi-frame operation at rates of up to 10 fps (frames per second). The digitization accuracy typically is only about 10 bits, but can be 14 to 16 bits if the charge integration time is sufficiently long. The high end of digitization accuracy currently is accomplished in imaging systems wherein the typical charge integration times range from several hundred milliseconds up to a few seconds. Therefore, in these current imaging systems, increasing accuracy requires increasing the pixel charge integration time. Unfortunately, errors inherent in current imaging systems limit the length of a charge integration cycle to just a few seconds at most, before the signal-to-noise ratio first "saturates" and then becomes so bad as to preclude any increase in accuracy with increasing charge integration time.

In any event, it is the cumulative integrated analog signal that is readout from the camera and digitized. Then calibration is applied to correct the non-uniformities inherent in flat panel imaging device, and more rarely to correct the non-linear behavior of the imaging system itself.

Designing and manufacturing a sensitive, high energy radiation-imaging device is a very complex task. All the device's structural modules and performance features must be carefully designed, validated, assembled and tested before a fully functioning camera can be constructed. Although great progress has been made in the research and development of semiconductor radiation imaging devices, a large number of old performance issues remain and certain new performance issues have developed. Some of the new performance issues result from solving other even more severe performance problems, while some are intrinsic to the operating principle of such devices.

High energy "direct radiation detector" type x-ray imaging systems typically utilize semiconductor detector substrate composed of Cd—Te or Cd—Zn—Te compositions. The Cd—Te or the Cd—Zn—Tc detector substrate is typically bump-bonded to a CMOS readout (signal processing) substrate. It can also be electronically connected to the CMOS readout with the use of conductive adhesives (see US Patent Publication No. 2003/0215056 to Vuorela). Each pixel on the CMOS readout substrate integrates the charge generated from the absorption the impinging x/gamma rays in the thickness of material of the detector substrate. The known performance impacting issues with Cd—Te or Cd—Zn—Te/ CMOS based charge-integration devices can be divided into two major areas: electrical performance problems and materials/manufacturing defects. Electrical performance problems can be further subdivided into six different though partially overlapping problems: leakage current, polarization or charge trapping, temporal variation, temperature dependency, X-ray field non-uniformity, and spectrum dependency. Materials/manufacturing defects problems can also be further subdivided into: Cd—Tc or Cd—Zn—Tc detector material issues, CMOS-ASIC production issues, and overall device manufacturing issues.

The main reasons for use of crystalline compound semiconductors such as CdTe and CdZnTe in the detector substrate of a charge-integrating imaging device is their superb sensitivity, excellent pixel resolution, and quick response (very little afterglow) to incoming radiation. On the other hand, current methods of producing Cd—Te and Cd—Zn—Te flat panel substrates limits their uniformity and impacts the crystal defect rate of these materials, which as can cause some of the problems mentioned above. In addition, due to the use of an electric field of the order of 100V/mm or higher, a considerable leakage current (or dark current) results, causing image degradation.

Prior descriptions of Cd—Te or Cd—Zn—Te based x-ray/ gamma ray imaging devices exist. For example, U.S. Pat. No.

5,379,336 to Kramer et al. and U.S. Pat. No. 5,812,191 to Orava et al. describe generally the use of Cd—Te or Cd—Zn—Tc semiconductor detector substrates bump-bonded to ASICs substrates of a charge-integration type digital imaging camera. However, these documents make no mention of and do not address the issues arising when a device of this type operates at high frame rates exceeding 10 fps, or how to calibrate, or even the need to calibrate in the case of such an application. Another example is European Patent EP0904655, which describes an algorithm for correcting pixel values of a Cd—Te or Cd—Zn—Te imaging device. However the issue of operating the device at high rates and how to compose an image from many uncorrected individual frames is not addressed. EP0904655 simply provides a correction algorithm for correcting pixel values from a single exposure and consequently displaying such pixel values.

Although these prior devices and methods may be useful each for its intended purpose, it would be beneficial in the field to have a high energy x-ray, real time imaging system that provides both increased image frame readout rates of substantially greater than 10 fps and greater than 16 bit accuracy. For example, it would be useful in the fields of panoramic dental imaging, cephalometry, and computerized tomography to have high energy X-ray imaging systems with both increase frame readout rates and high accuracy. Even static imaging applications, where the exposure time is a multiple of the single frame duration, it would be useful to have such an imaging system.

SUMMARY OF THE INVENTION

The present invention is a high energy, direct radiation conversion, real time X-ray imaging system. More specifically, the present real time X-ray imaging system is in tended for use with Cd—Te and Cd—Zn—Te based cameras. The present invention is particularly useful in X-ray imaging systems requiring high image frame acquisitions rates in the presence of non linear pixel performance such as the one encountered with CdTe and CdZnTe pixilated radiation detectors bonded to CMOS readout. The present invention is "high energy" in that it is intended for use with X-ray and gamma ray radiation imaging systems having a field strength of 1 Kcv and greater. The high energy capability of the present X-ray imaging system is derived from its utilization of detector substrate compositions comprising Cadmium and Telluride (e.g., Cd—Te and Cd—Zn—Te based radiation detector substrates) in the imaging camera. Cd—Te and Cd—Zn—Te based detector substrates define the present invention as being a direct radiation conversion type detector, because the impinging radiation is directly converted to electrical charge in the detector material itself.

The detector substrate is a monolith and has a readout face or surface which is highly pixelized, i.e., it has a high density pattern of pixel charge collectors/electrodes on it. The pattern is high density in that the pitch (distance from center-to-center) of the pixel charge collectors is 0.5 mm or less. Each pixel's collector/electrode is in electrical communication (e.g., via electrical contacts such as bump-bonds or conductive adhesives) to the input of a pixel readout ASIC ("Application Specific Integrated Circuit") on the readout/signal processing substrate. The detector substrate provides for directly converting incident x-rays or gamma radiation to an electrical charge and for communicating the electrical charge signals via the pixel electrical contact to the readout ASIC. The readout/signal processing ASIC provides for processing the electrical signal from its associated pixel as necessary (e.g., digitizing, counting and/or storing the signal) before sending it on for further conditioning and display. The capability of the present invention to be read out at high frame rates enables the real time imaging feature and secondly enables image reconstruction (real time or static) from a plurality of digitized individual frames. Real time imaging refers to the capability of the system to generate image frames for display in sufficiently rapid succession to provide a moving picture record in which movement appears to occur substantially real time to the human eye.

Descriptions of flat panel x-ray imaging cameras substantially analogous to the intended Cd—Te or a Cd—Zn—Te based charge-integrating detector bonded to an ASIC readout/signal processing substrate are known in the art. Examples are disclosed in US Patent Application Publication serial number 2003-0155516 to Spartiotis et al. relating to a Radiation Imaging Device and System, and US Patent Application Publication serial number 2003-0173523 to Vuorela relating to a Low Temperature, Bump-Bonded Radiation Imaging Device, which documents are incorporated herein by reference as if they had been set forth in their entirety.

In a preferred embodiment of the present imaging system, the imaging device or camera is "readout" at a high frame rate. A high frame rate as used herein means that the accumulation and distribution or electrical charge developed in the detector semiconductor substrate is utilized ("readout") to produce a digital image frame at a rate greater than about 10 individual image frames per second up to 50 and greater individual image frames per second and in certain embodiments up to 300 frames per second or more. An individual image frame is a digital representation of the active area (pixel pattern) of the camera's detector substrate. An image frame is generated each time the ASIC substrate is readout. The digital representation can he described as a matrix of digitized individual pixel signal values. That is, each pixel value of each pixel in the image frame is a digitized representation of the intensity of the electronic signal level readout for the corresponding specific pixel on the detector substrate.

In accordance with the invention, each pixel value in the image frame includes an individual calibration correction specific to that pixel value of the specific frame, and therefore in fact is a corrected digital pixel value. The specific calibration correction for each image pixel is derived from the present pixel value correction calibration process. The individual corrected digital pixel values of the same specific image pixel from different image frames is processed according to an algorithm of the calibration process over at least some of the collected image frames to provide the pixel value to be displayed in the final image. The final image can be a real time image or a static digitally accumulated image.

A characteristic of the present invention is that the final image to be displayed has pixel values with a bit depth that is higher than the bit depth of pixels from individual frames. For example, each frame may have a 12 bit resolution but when accumulating several such frames to compose a real time or static image the final pixel depth in the displayed image can indeed be 14, 16 or even 18 bits in real terms. This is a significant advancement over the prior art because the extra bit resolution does not come at the expense of performance in other respects. For example, in the prior art, in order to get 16 bits or more, one has to integrate on the device (analog integration) for several hundred milliseconds or even seconds. However, in doing so, one integrates dark (or leakage) current and other types of noise as well. To achieve the desired performance, it is of paramount importance that the individual frames are calibrated and that pixel values of individual frames be corrected with high precision. Therefore, it is a further object of the present invention to provide such a calibration (or correction) method to enable the current invention to be implemented. The calibration method is applicable on each pixel of the imaging system and takes into account the offset and gain corrections as well as temporal (time) corrections as this is applied on a frame by frame basis. There may be no need to have different correction for each pixel and each frame but, in accordance with the current invention, at least some of the frames have different temporal correction for corresponding pixels.

BRIEF DESCRIPTION OF THE DRAWINGS

FIG. 1a is a block diagram generally illustrating the interconnect relationship of components of the present high energy, direct radiation conversion, real time X-ray imaging system.

FIG. 2b is a cross-sectional side view of the camera of the invention.

FIG. 5 is a graph illustrating the temporal variation in the raw intensity value of the same single image pixel of FIG. 4a overlaid with a series of image frame capture points generated over time after a bias voltage switching event.

FIG. 6 is a graph illustrating normalization of the intensity value of an image pixel by the application of a specific time dependent correction coefficient to the raw intensity value of the particular image pixel's output in each image frame.

FIG. 7 is a graph illustrating an asymmetric data sampling feature of the calibration procedure of the present imaging system for ameliorating the problem of excessive data collection and processing load.

FIG. 13 is a block flow diagram illustrating the application of the present calibration process to provide a normalize image frame.

FIG. 14a is a graph illustrating the typical prior uniform sampling method wherein a piece-wise constant function is used to determine correction coefficient for normalizing pixel intensity values at specific times or intensities to fit a curve.

FIG. 14b is a graph illustrating a non-uniform sampling method wherein a piece-wise constant function is used to determine correction coefficients for normalizing pixel intensity values at specific times.

FIG. 14c is a graph illustrating an alternative (non-uniform) sampling method wherein a piece-wise linear function is used to determine correction coefficients for normalizing pixel intensity values at specific times.

DETAILED DESCRIPTION OF THE INVENTION

Figure 1B:
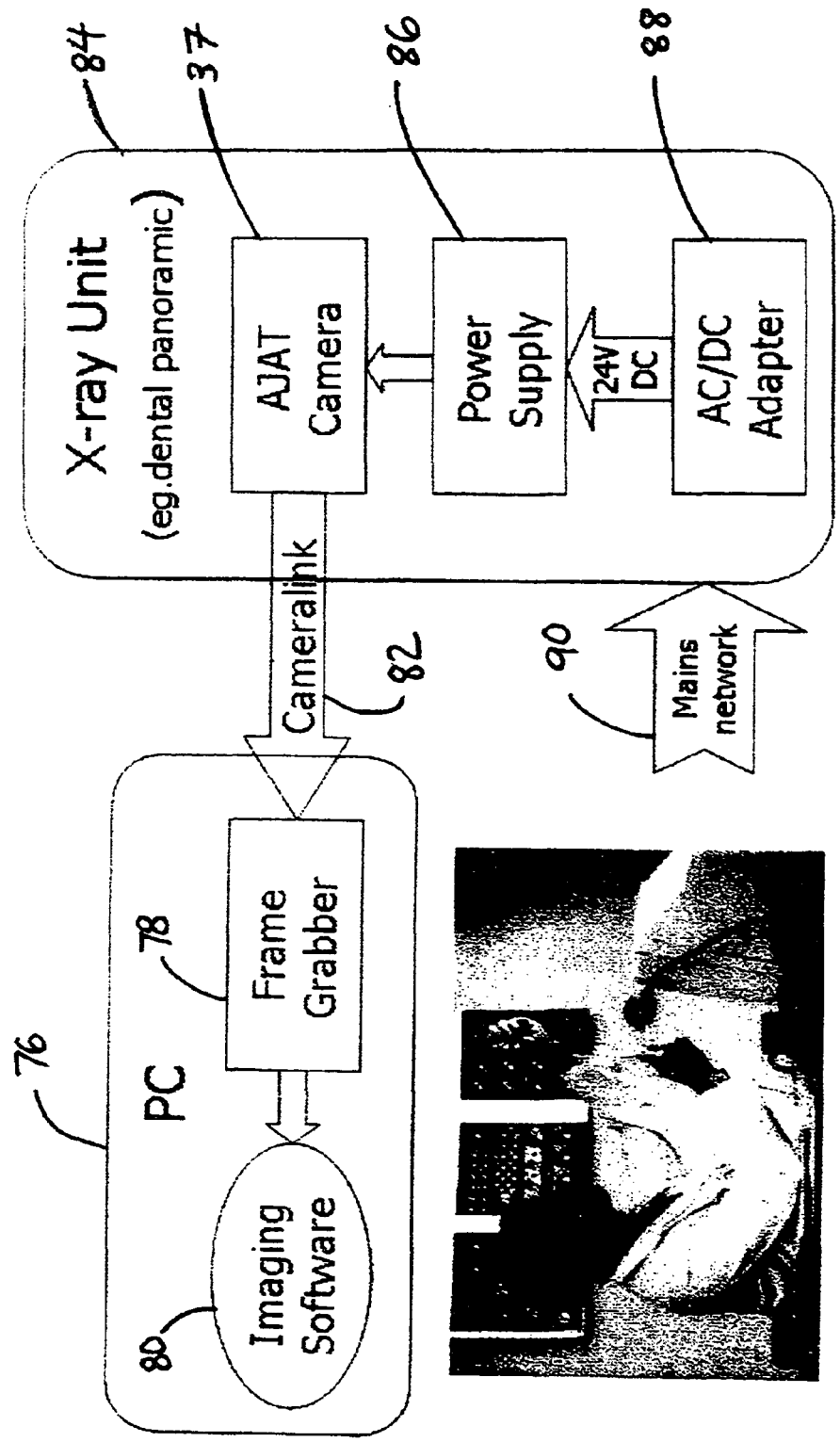
FIG. 1b is a schematic diagram of the X-ray imaging system of the invention.

Referring now to the drawings, the details of preferred embodiments of the present invention are graphically and schematically illustrated. Like elements in the drawings are represented by like numbers, and any similar elements are represented by like numbers with a different lower case letter suffix. As illustrated in FIGS. 1a and 2b, the present invention is a high energy, real-time capable, direct radiation conversion X-ray imaging system 10. More specifically, the present invention relates to such X-ray imaging systems 10 utilizing a Cd—Te or Cd—Zn—Te based camera. The present real-time capable X-ray imaging system 10, like imaging systems generally, comprises a camera module, an image processor 14, and a display means 16. In the present real-time X-ray imaging system 10, the camera module 12 includes an X-ray imaging device 28 having a Cd—Te or Cd—Zn—Te based radiation detector substrate 30 in electrical communication with an Application Specific Integrated Circuit (ASIC) readout substrate 32. Each active pixel 36 on the detector 30 is electrically connected to a corresponding pixel circuit 31 on the ASIC readout substrate 32.

Referring now to FIG. 1b, the system 10 includes a PC 76, in which a frame grabber 78 and imaging software 80 operate, connected via a camera link 82 to the X-ray unit 84, including a camera 37, power supply 86, and ac/dc adapter 88. The X-ray unit 84 generally further includes network connections 90 for connecting to the PC or terminals in a network, for example.

Figure 2A:
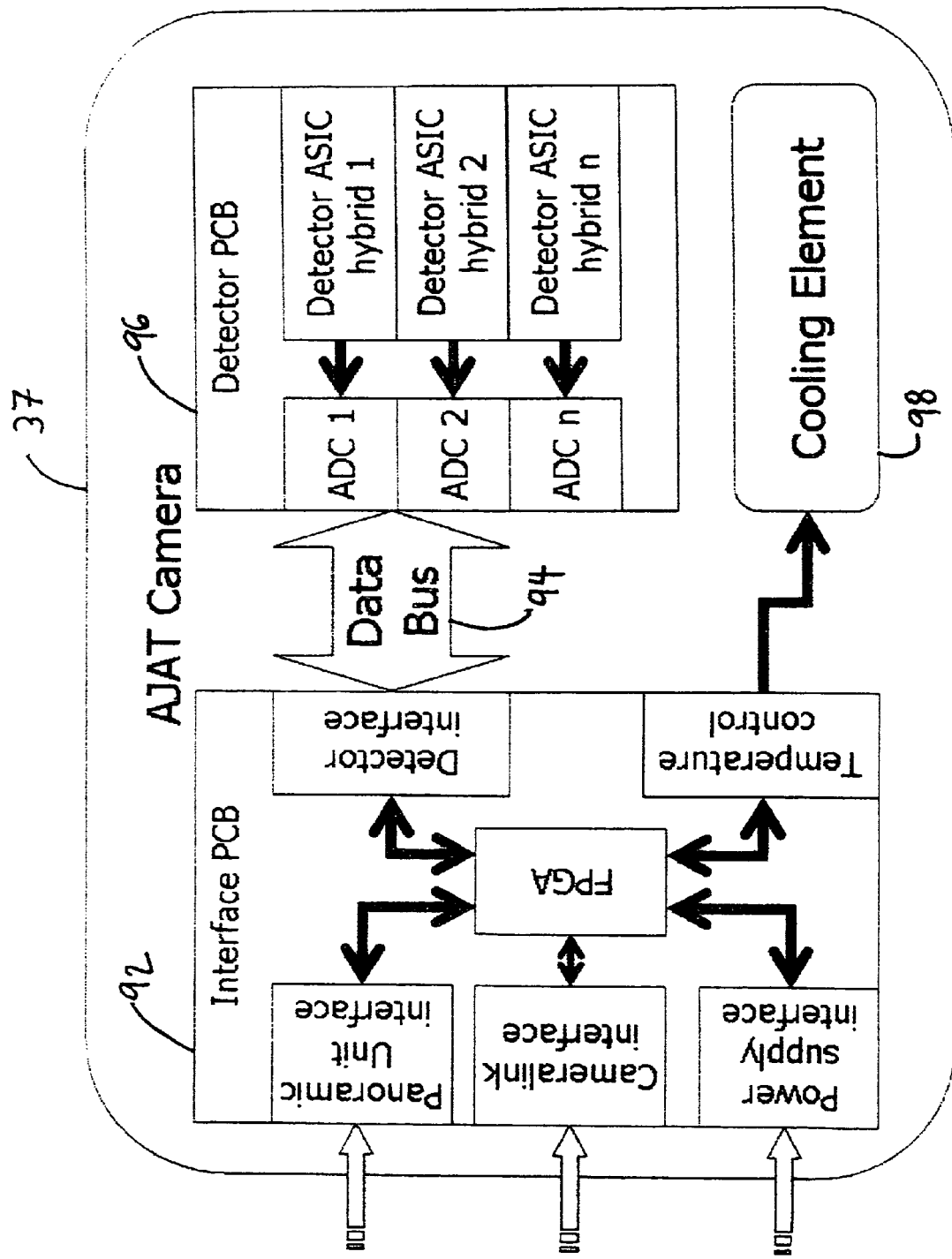
FIG. 2a is a schematic representation of an imaging device useful in the camera module of the present invention.

Referring now to FIG. 2a, the camera 37 has an interface printed circuit board (PCB) 92 connected via a databus 94 to a Detector PCB 96 and having a cooling element 98.

The x-ray imaging device 28 is capable of producing multiple image frames 44 Each frame 44 is made up of an array 45 of un-corrected image pixel values.

Referring now to FIG. 2b, a schematic representation of an imaging device 28 useful in the camera module 12 of the present imaging system 10 is shown. In these imaging devices 28 as generally exemplified in FIG. 2, the detector semiconductor substrate 30 has electrically connections 35 to an readout ASIC substrate 32 (e.g., hump-bonds in the preferred embodiment illustrated). The detector material 34, a Cadmium-Telluride or Cadmium Zinc Telluride based composition in the present invention, of the semiconductor substrate 30 absorbs incoming radiation, and in response to the absorption the radiation energy is directly converted to electrical charges within the thickness of the detector material 34. The electrical charges are collected at the detector pixel's collection electrode (pixel contact) 38 of each active or functioning pixel 36, and electrically communicated through the electrical connections 35 to the pixel circuit contacts 33 on the pixel circuit 31 of the readout ASIC substrate 32. The electric charge signals are stored and/or processed at a detector pixel's corresponding pixel circuit 31 on the readout ASIC 32. Thereafter, the ASIC pixel circuits 31 are usually multiplexed and an analog output is sequenced and digitized either on chip or off-chip. In accordance with the invention, each pixel value 36 in an image frame 44 is digitized and additionally includes an individual calibration correction specific to that pixel value of the specific frame, and therefore in fact is a corrected digital pixel value. The specific calibration correction for each image pixel 47 is derived from a plurality Of individual single frame pixel values 36 corrected according to a correction calibration process. The individual corrected digital pixel values 36 of the same specific image pixel 47 from different image frames 44 are processed according to an algorithm of the normalization module 24 over at least some of the collected image frames 44 to provide the pixel value to be displayed in the final image. The final image can be a real time image or a static digitally accumulated image.

Figure 2C:
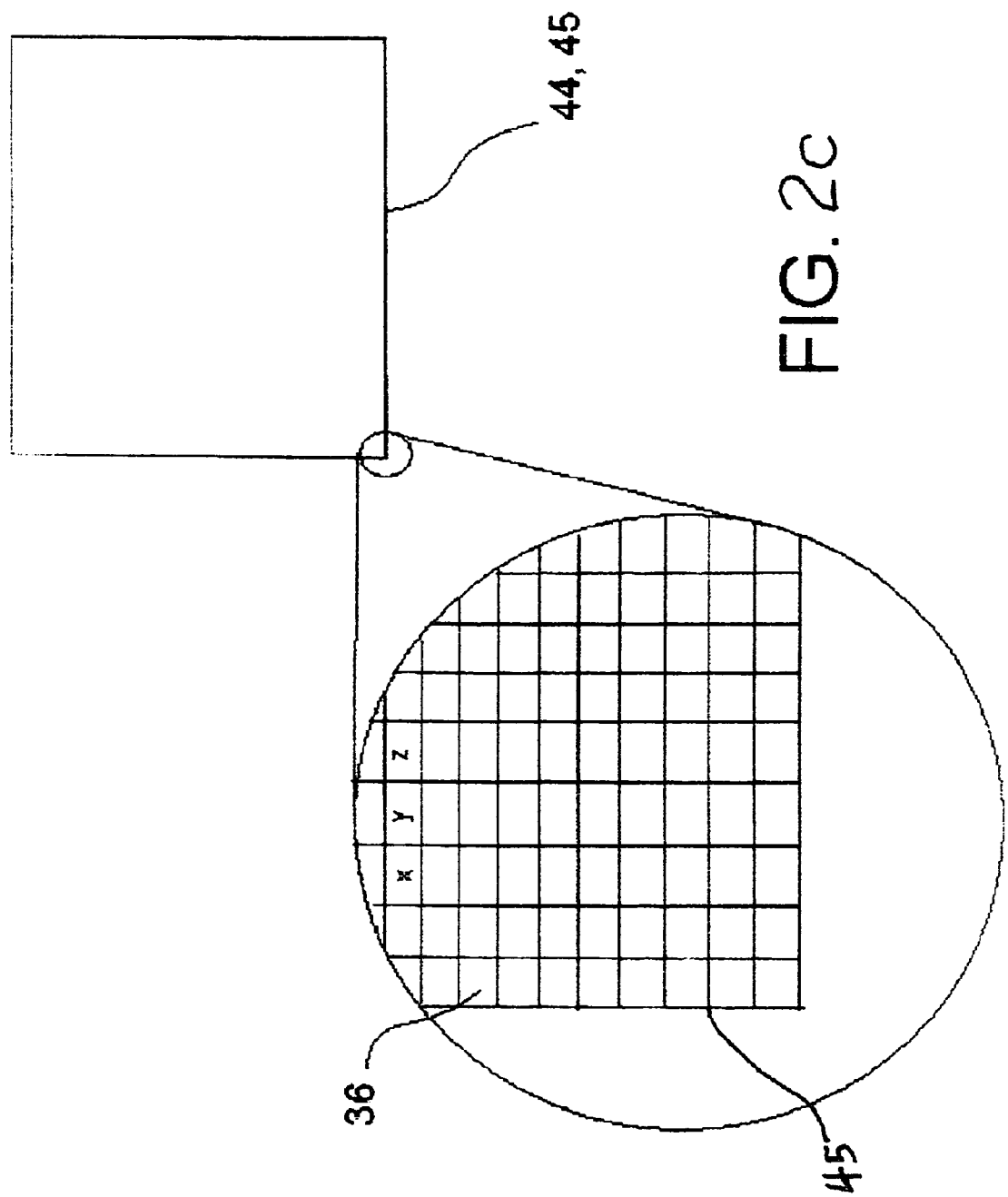
FIG. 2c is a schematic view of the camera and/or frame of the invention, made up of an array of image pixels.

Referring now to FIG. 2c, the imaging device 28 of the invention is capable of producing multiple image frames 44, each frame including an array 45 of frame pixel values 36, with a certain bit depth (i.e. the color or gray scale of an individual pixel—a pixel with 8 bits per color gives a 24 bit image, because 8 Bits×3 colors is 24 bits—e.g., 24 bit color resolution is 16.7 million colors). The system 10 includes processing means 24 for calculating image pixel values 47 from pixel values 36 of different frames 44, wherein the bit depth of the image pixel values 47 is greater than the bit depth of the pixel values 36 from the individual frames 44. By way of example, single frame digitization may be for example only 12 bits, or 0 to 4096, maximum. Such analog to digital converters (ADC's) are quite common and inexpensive today. Additionally, they can be quite fast and operate with clock rates of 5 MHz or even 10 MHz-20 MHz. A typical CdTe-CMOS camera as implemented by the assignee of the current invention may comprise 10 k pixels to 1 M pixels. This means that frame rates of 20 fps-300 fps or even up to 2,000 fps can be achieved with a single ADC. After the frames 44 are read out, un-corrected pixel values are digitized and, consequently, in accordance with the present invention, a correction, calculated using a pixel correction algorithm 20, is applied to the digital pixel values to obtain corrected frame digital pixel values 36 from single frames. Then, as depicted in FIG. 3a, digital corrected pixel values 36 from different frames 44 can be accumulated to yield digital corrected pixel values 47 of an image to be displayed with a bit resolution far greater than the 12 bits. For example, with 17 frames of 12 bit resolution, each one can become more than 16 bit after digital accumulation (17×4096=69632>16 bits). This indeed is a breakthrough in digital x-ray imaging because such resolutions were previously achievable at the expense of long integration times and the use of 16 bit ADC's that are very expensive and very slow, thus inhibiting real time image display. Additionally, as was explained and will be explained further, long integration times of the analog signal cause other problems such as an increase of the dark current and other types of noise.

Figure 3B:
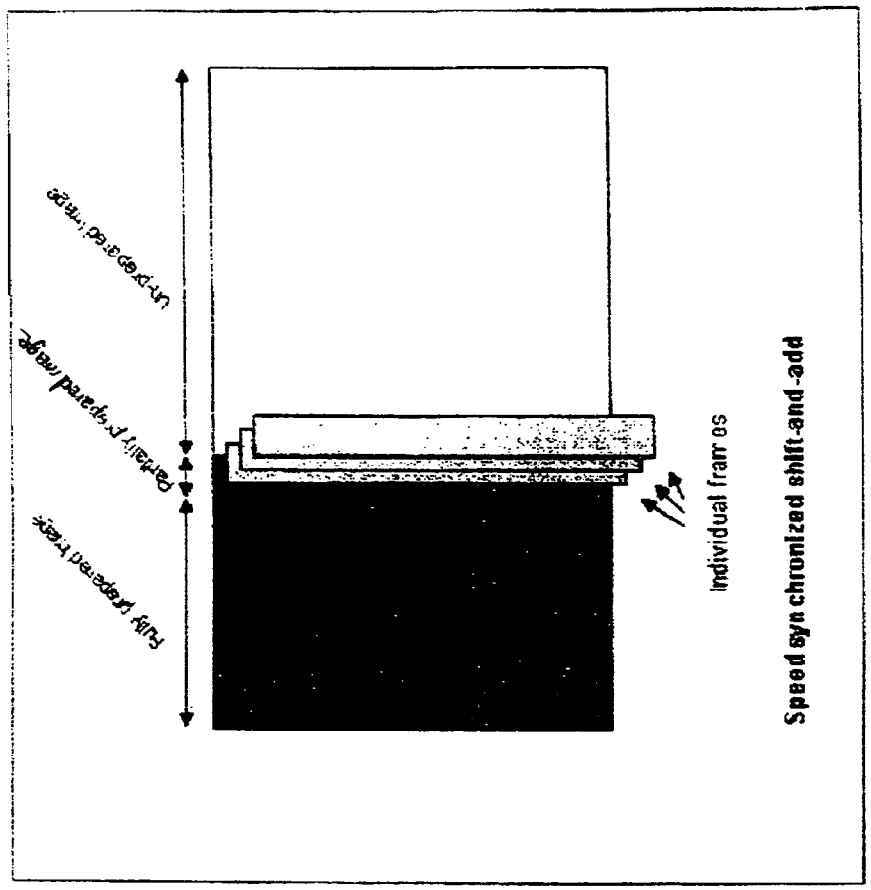
FIG. 3b is a schematic representation of the shift-and-add method of the invention.
Figure 3A:
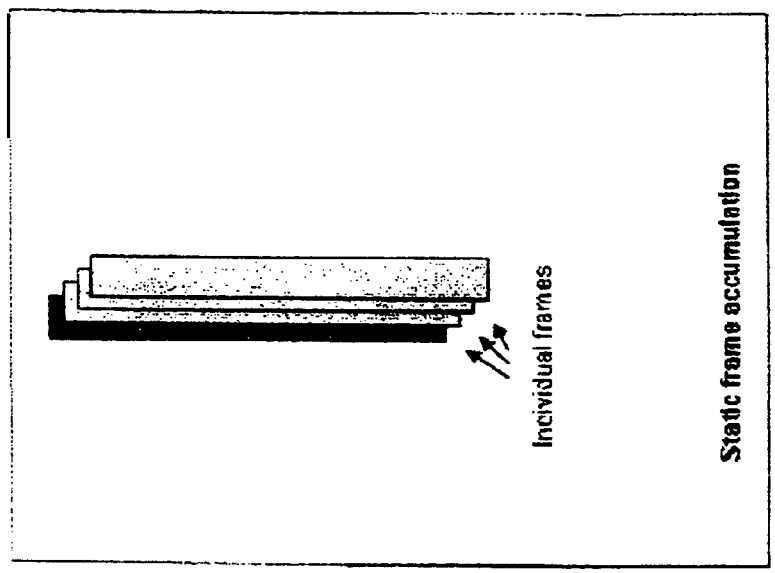
FIG. 3a is a schematic representation of the static frame accumulation method of the invention.
Figure 3C:
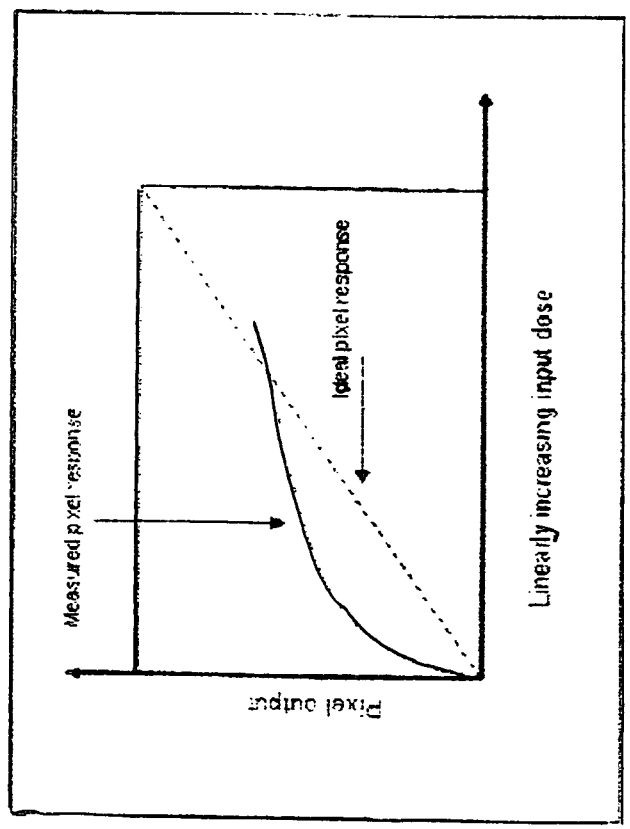
FIG. 3c is a graph of the measured pixel response compared with the ideal pixel response.

Referring now to FIG. 3b, corrected digital pixel values 36 combined from different frames 44 can be corresponding pixel values or can he from different positions in the frame 44 (such as in the case of scanning). In essence, the system 10 includes a method 20, 49, for correcting the image pixel values from different image frames 44, and a processing method 24 for calculating corrected pixel values 47 of an image, the method utilizing corrected digital pixel values which correspond in a broad sense, from several frames.

As mentioned, the current invention 10 comprises preferably a CdTe or CdZnTe based x-ray/gamma-ray imaging device 28 whereby the CdTe/CdZnTe pixilated detector substrate or substrates 30 is/are bump-bonded to at least one readout ASIC 32, the CdTe/CdZnTe detector substrate provided for directly converting impinging x-rays or gamma rays to an electronic signal and the readout ASIC provided for storing and/or processing the electronic signal from each pixel 36 and consequently reading out the signal. The CdTe/CdZnTe imaging device 28 is read out at a high frame rate of preferably 10 individual frames per second, or even more preferably 25 fps-100 fps and in some cases up to 300 fps or more. The individual frames 44 are being digitized so that each frame is a string of pixel values 36, each pixel value corresponding to a digitized signal level for a specific pixel 36 in the frame that was produced by the device 28. The digitized pixel values for each frame 44 are being corrected in accordance with a pixel correction algorithm 49 already described hereafter. The individual corrected digital pixel values 36 of different frames 44 corresponding to the same pixel 36 are digitally added or averaged or processed according to an algorithm over at least some of the collected frames to provide a pixel value 47 to be displayed in the final image.

Critical to the invention is the actual implementation of the correction of the digital pixel values from each individual frame 44 which has to take into account all the deficiencies of the CdTe or CdZnTe crystals, CMOS non-linearity and offsets, dark current, polarization and other effects which will be subsequently explained. In the next section, real time, efficient pixel correction is described. Different correction and/or calibration techniques may be used in the present invention, without changing the scope or diverting from the invention.

The camera module 12 and the high speed frame processor module 18 are in communication via a cable link 60. The camera module 12 provides processed and organized pixel data, representing the individual raw pixel circuit output of each pixel 36 (or pixel cell 29), to the frame processor module 18. The high speed frame processor module 18 includes a circuit for the frame grabber 78 (optionally frame grabber 78 may also he part of the camera module 12). typical in the field, which captures the pixel circuit data from the camera module 12 further processes the pixel circuit data to provide a raw time-stamped image frame representing the raw pixel circuit output of each pixel cell 29. The frame processor then communicates the raw time-stamped image frame data via a frame data link 66 to the calibration module 20 if the system 10 is in the calibration mode, or otherwise to the normalization module 24.

The calibration module 20 controls the calibration process 49. The calibration process 49 analyzes the raw time-stamped image frame data and other calibration parameters, such as reference field radiation intensity, and generates the data necessary to load the look-up table of the calibration data structure module 22. The calibration module 20 writes to the data structure via a database link 68. Without proper calibration data loaded into the look-up table, any image output from the normalization module 24 to the display module will be inaccurate. Therefore, the calibration process 49 must be run prior to normal imaging operation of the present system 10.

When not in calibration mode, the frame processor 18 communicated the time-stamped data of the image frame 44 to the normalization module 24. The normalization module 24 operates on each image pixel of the raw time-stamped image frame with the image pixel's corresponding correction requirement derived from the look-up table via a second database link 70. The normalization module 24 then provides a normalized image frame to the display module 16 via a display data link 74. Every image pixel of the normalized image frame represents its corresponding raw image pixel intensity value corrected by it corresponding correction coefficient from the look-up table.

To obtain a high quality image, several obstacles need to be overcome in relation to Cadmium-Telluride based detector substrates 30. For example, there is a continuous leakage current (aka: dark current) that must be compensated for. Certain Cd—Te or Cd—Zn—Tc detector materials 34 are manufactured having a blocking contact (not shown) to control the level of leakage current. Other manufactures have various amounts of Zn or other dopants in the detector material 34 to suppress leakage current. In any event the leakage current creates noise and also fills up the charge collection gates 33 on each pixel circuit 31. Additionally the use of blocking contacts introduces the problem of polarization or charge trapping which becomes evident after few seconds of operation, for example, after 5 sec, 10 sec or 60 seconds etc., depending on the device.

The advantage of using Cadmium-Telluride based compositions (i.e., Cd—Te and Cd—Zn—Te) as the radiation absorption medium 34 in the present detector substrate 30 is their very high radiation absorption efficiency, minimal afterglow and their potential for high image resolution. Therefore, it is valuable to have imaging systems that mitigate or eliminate the above issues. Even in the absence of a blocking contact the issue of the leakage current and crystal defects do not allow long exposures in excess of 100 msec without increasing the size of the charge storage capacitor on each pixel circuit 31 of the ASIC readout substrate 32. However, this would be to the detriment of sensitivity, because the larger the charge storage capacitance is, the lower the sensitivity becomes. For example, the present invention has been successfully practiced using a capacitance of the order 50 fF as charge storage capacitance on each ASIC pixel circuit receiving charge. With this size of capacitance, the practical maximum exposure time given the Cd—Te or Cd—Zn—Te leakage current and other defects would be 100 msec or less.

Figure 4A:
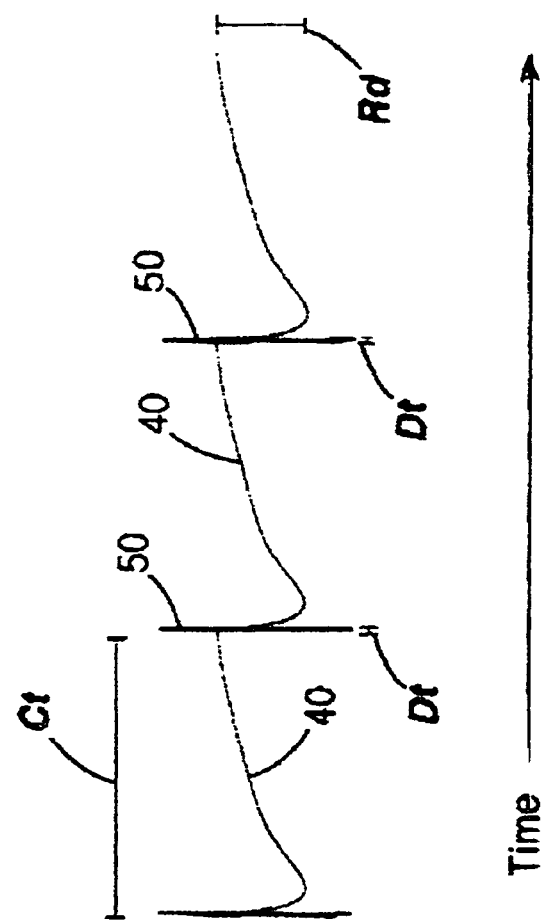
FIG. 4a is a graphic representation of the output over time of a single pixel circuit of a Cd—Te based direct conversion camera using detector bias voltage switching. The figure illustrates that the output signal from a typical pixel circuit drifts over time as circuit recovers from a bias voltage switching event (pulse).
Figure 4B:
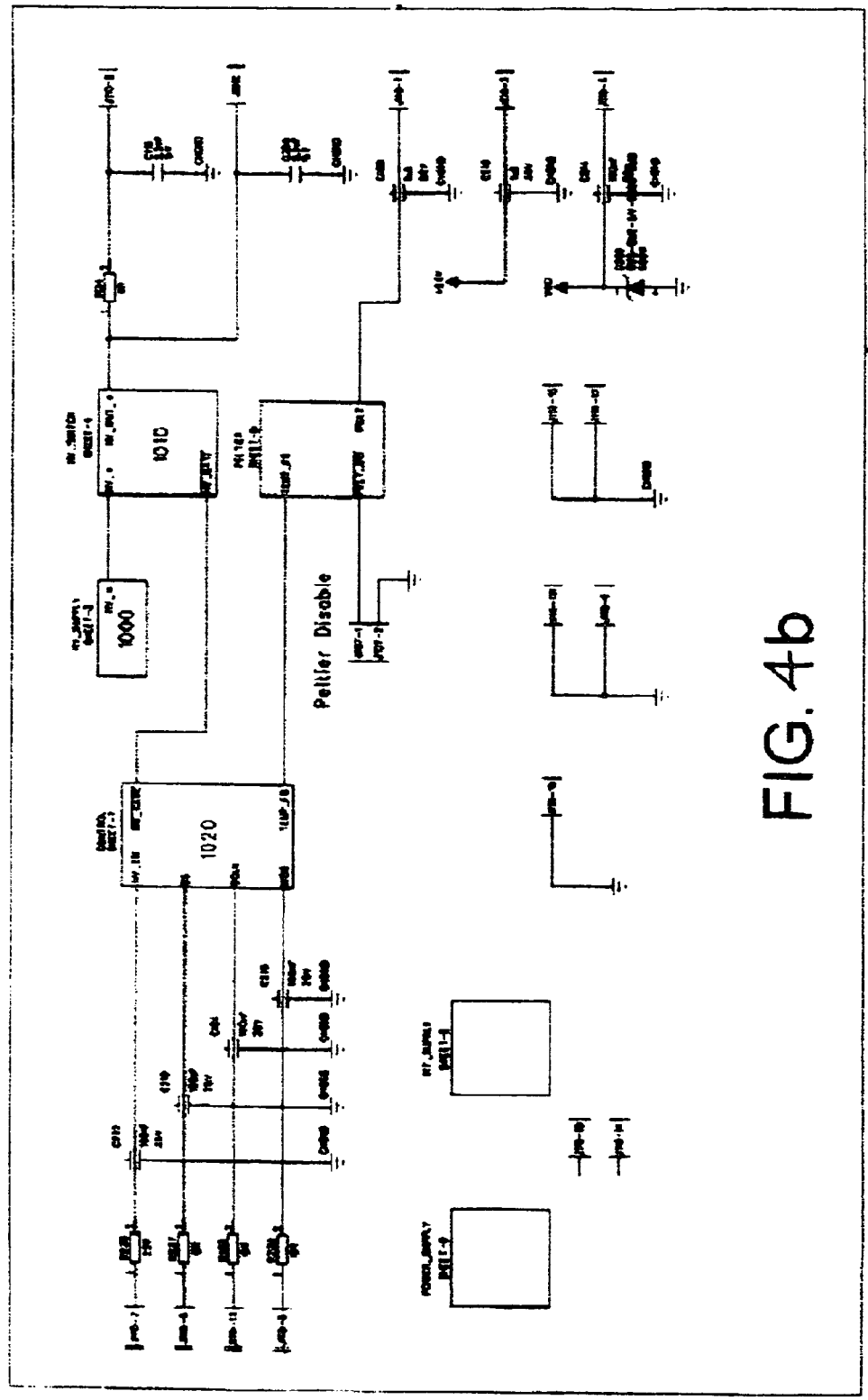
FIG. 4b is a schematic of the detector substrate bias switching circuit used in the invention.

Referring now to FIGS. 4a and 4b, a very useful mechanism for preventing excessive polarization (charge trapping) from forming in a direct conversion (charge coupled) radiation detector device is to briefly cycle the high voltage bias off and on, a technique called the detector bias voltage switching technique, in which the detector substrate bias voltage is switched off for a brief period (less than 100 milliseconds) at the end of a data collection cycle. The duration of a data collection cycle is selectable, e.g., from every three to twenty or more seconds. Bias voltage switching prevents polarization or charge trapping from developing in the detector substrate 30. However, the bias voltage switching technique is new in the field of X-ray imaging systems, and does have certain aspects that can impact image quality if these are not addressed. One such aspect is "dead-time," and the other is "pixel response drift." "Dead-time" is the period in a data collection cycle when the detector bias voltage is off and no detector charges can be collected. "Pixel response drift" is the result of switching the detector bias voltage back on, and is the initial period that the data collection cycle that the pixel's response to a static radiation field has not yet stabilized. Both of these limitations are illustrated in FIG. 4a. The detector substrate bias switching circuit 121 is shown in FIG. 4b.

For the purpose of the embodiment illustrated in FIG. 4a, the data collection cycle time Ct was the time between the initiation of detector bias voltage off/on pulses 50. The dead-time Dt consists of the actual high voltage down-time Vo plus some stabilization time after the high voltage has been switched back on. The effect of dead-time Dt cannot be less than Vo, and hence cannot be completely eliminated in a switched detector bias voltage imaging system. However, it can be minimized in part by reducing the off-time of the bias voltage to as short a period as is appropriate to allow any polarization (trapped charge) to bleed off and/or to keep the dead-time to a negligibly small portion of the data collection cycle.

The other potentially limiting aspect of a bias voltage switched detector is pixel response drift Rd, which relates to the non-linear aspect of a pixel circuit's output signal over time 40 in response to a static radiation field exposure level (See FIG. 4a). This non-linearity is most pronounced immediately following the voltage-on step of the voltage off-on pulse 50. Uncorrected, this non-linearity causes pumping of the image's overall brightness level in a real time image display. The pixel cell non-linear response in a switched bias voltage imaging device is an excellent case for applying the post-image frame generation calibration method of the present imaging system to eliminate this intensity distortion of a real time X-ray image display.

Figure 9:
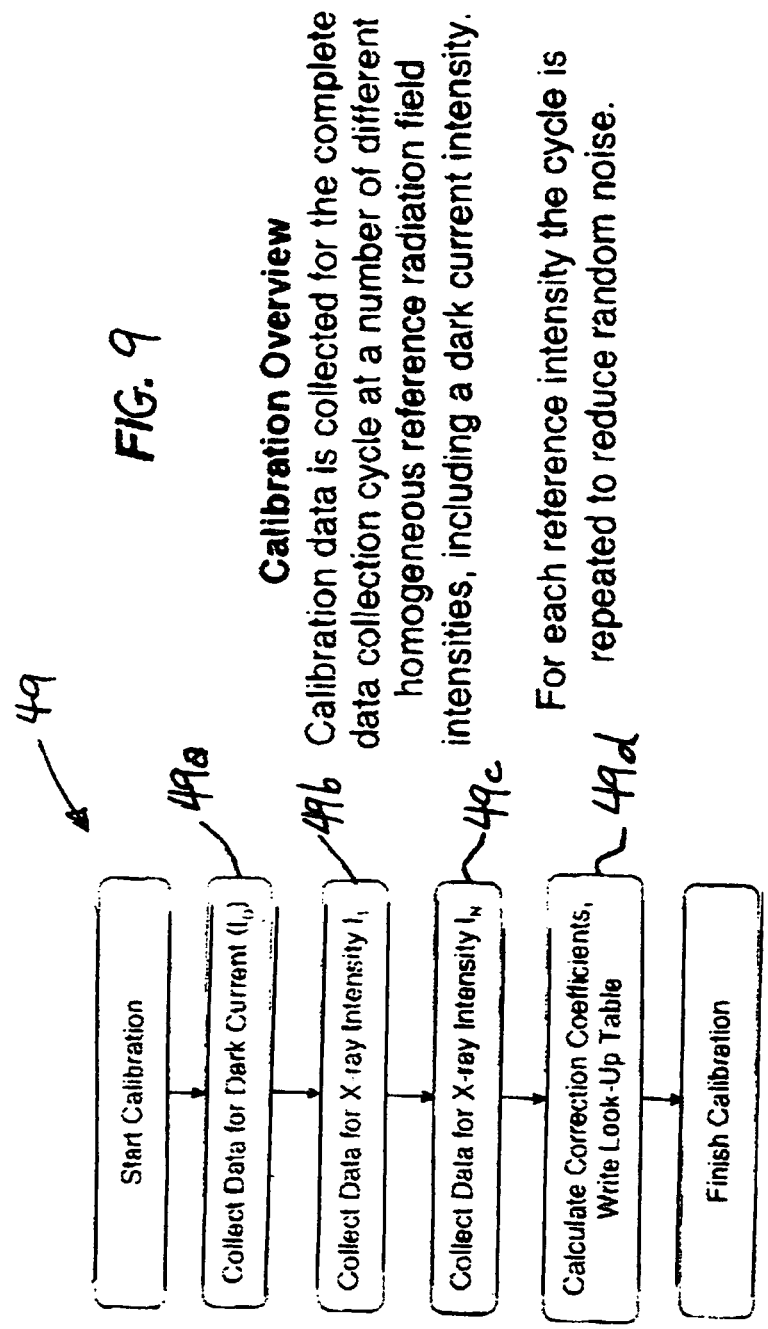
FIG. 9 is a block flow chart illustrating a general overview of the present calibration procedure.

Referring now to FIG. 9, the present calibration method 49 collects calibration data for the complete data collection cycle at a number of different homogeneous reference radiation field intensities, including a dark current intensity. Thus, the method 49 is especially useful for practice in digital imaging systems utilizing detector bias voltage switching. The camera module 12 of a digital imaging system utilizing detector bias voltage switching typically comprises a detector/ASIC assembly 28 having thousands of pixel cells 29, each comprising a detector pixel 36 and an associated pixel circuit 31. Each pixel circuit 31 includes associated circuitry and a pixel circuit signal output (not shown) producing a digitized pixel signal for that pixel circuit 31. A pixel circuit output signal indicates the intensity of the X-ray/Gamma ray radiation energy impinging on the associated detector pixel 36. See FIG. 2b. Further, for each reference intensity, the cycle is repeated to reduce random noise.

The collected digitized pixel signal outputs are communicated via a camera link 60 to a high speed frame processor module 18 of the image processor 14. The frame processor module 18 includes a frame grabber circuit which receives the individual pixel circuit output signals from each pixel circuit 31. The frame processor module organizes the individual digitized pixel signals into an image frame, with each image pixel of the image frame representing the pixel signal of a corresponding to the pixel circuit in the imaging device 28 of the camera module 12. The intensity of an image pixel in the image frame is representative of the strength of the pixel signal received from the corresponding pixel circuit 31. However, because of the inherent differences in the mechanical and electrical properties of the individual constituents of each pixel cell 29, the intensity response of the various pixels comprising an image frame are not uniform, even in response to a uniform x-ray field. Therefore, calibration of the imaging system is necessary before the information represented by the image frame is useful to a user.

The Calibration Procedure

Figure 8:
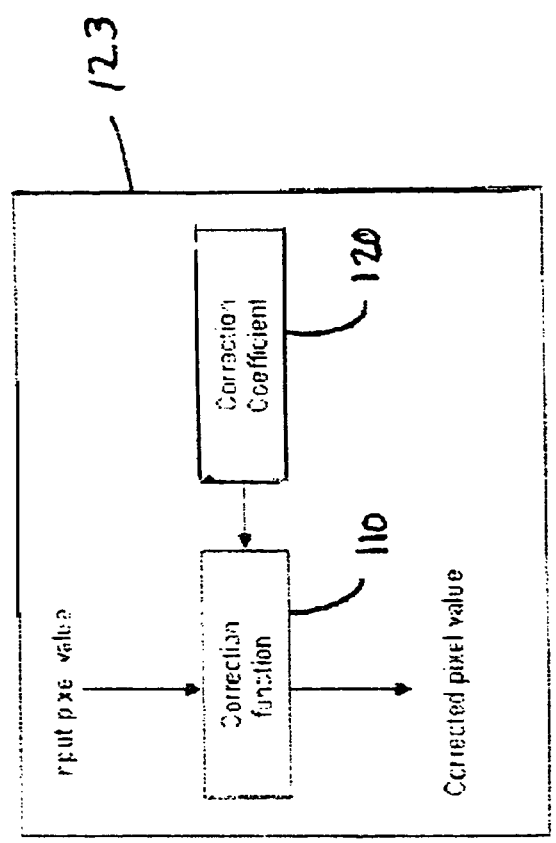
FIG. 8 is a simple block diagram of the calibration procedure of the invention.

Referring now to FIG. 8, a very high level flow chart of the calibration procedure 49 is shown, including the input of a pixel value 36 into a correction function 110, in which a correction coefficient 120 is applied, to yield a corrected pixel value 47. FIG. 9 is a more detailed overview of the steps of the calibration process 49 of the present imaging system 10. Calibration data is collected for the complete data collection cycle at a number of different homogeneous reference radiation field intensities, including a dark current intensity $I_D$. In a first step 49a, data is collected for dark current $I_D$. In a second step 49b, data is collected for X-ray intensity $I_1$. In a third step 49c, data is collected for X-ray intensity $I_N$. In a fourth step 49d, correction coefficients are calculated and the look-up table 22 written to.

Figure 10:
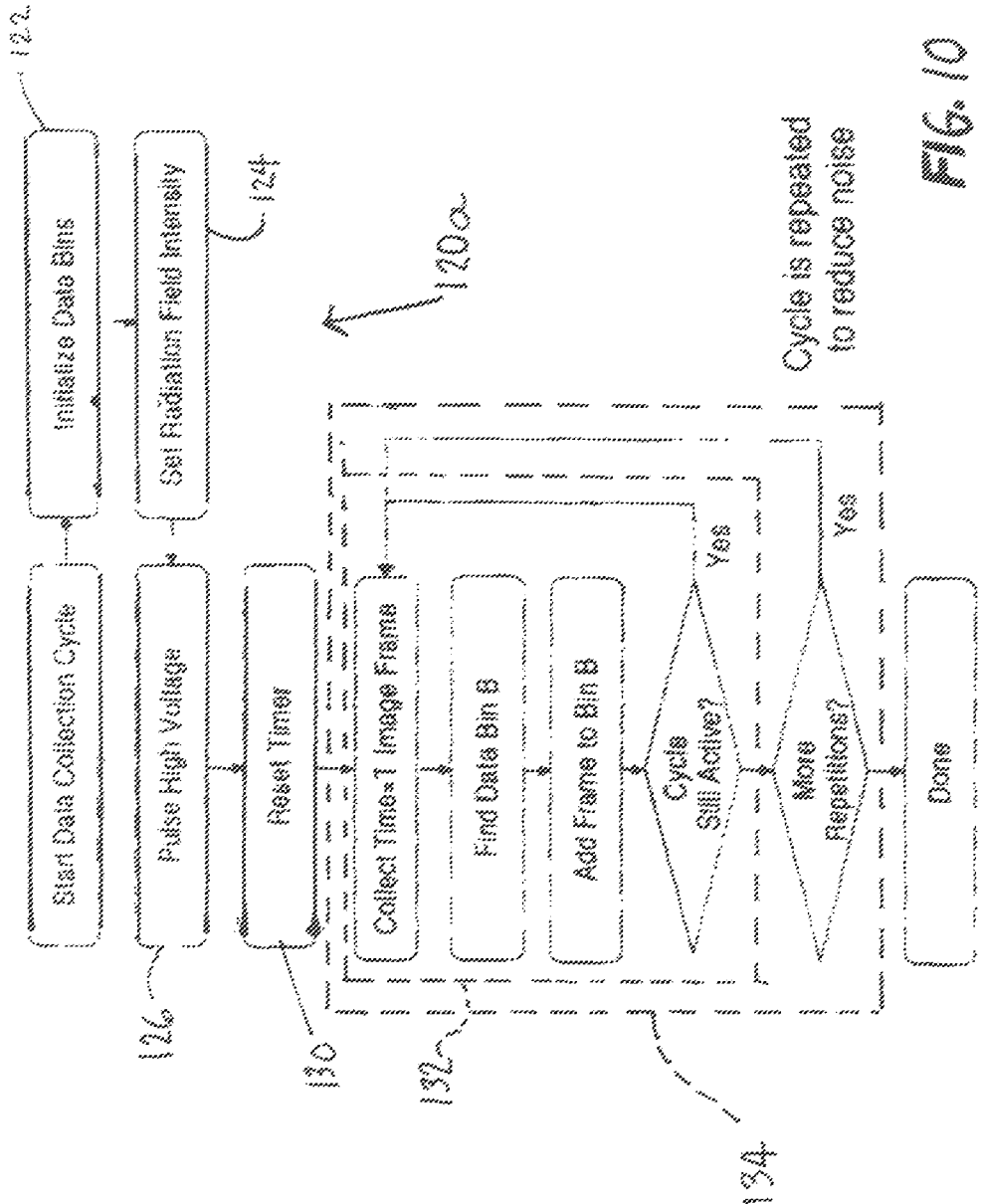
FIG. 10 is a block flow diagram illustrating a data collection strategy from a single pixel circuit at a specific reference X-ray field intensity.
Figure 11:
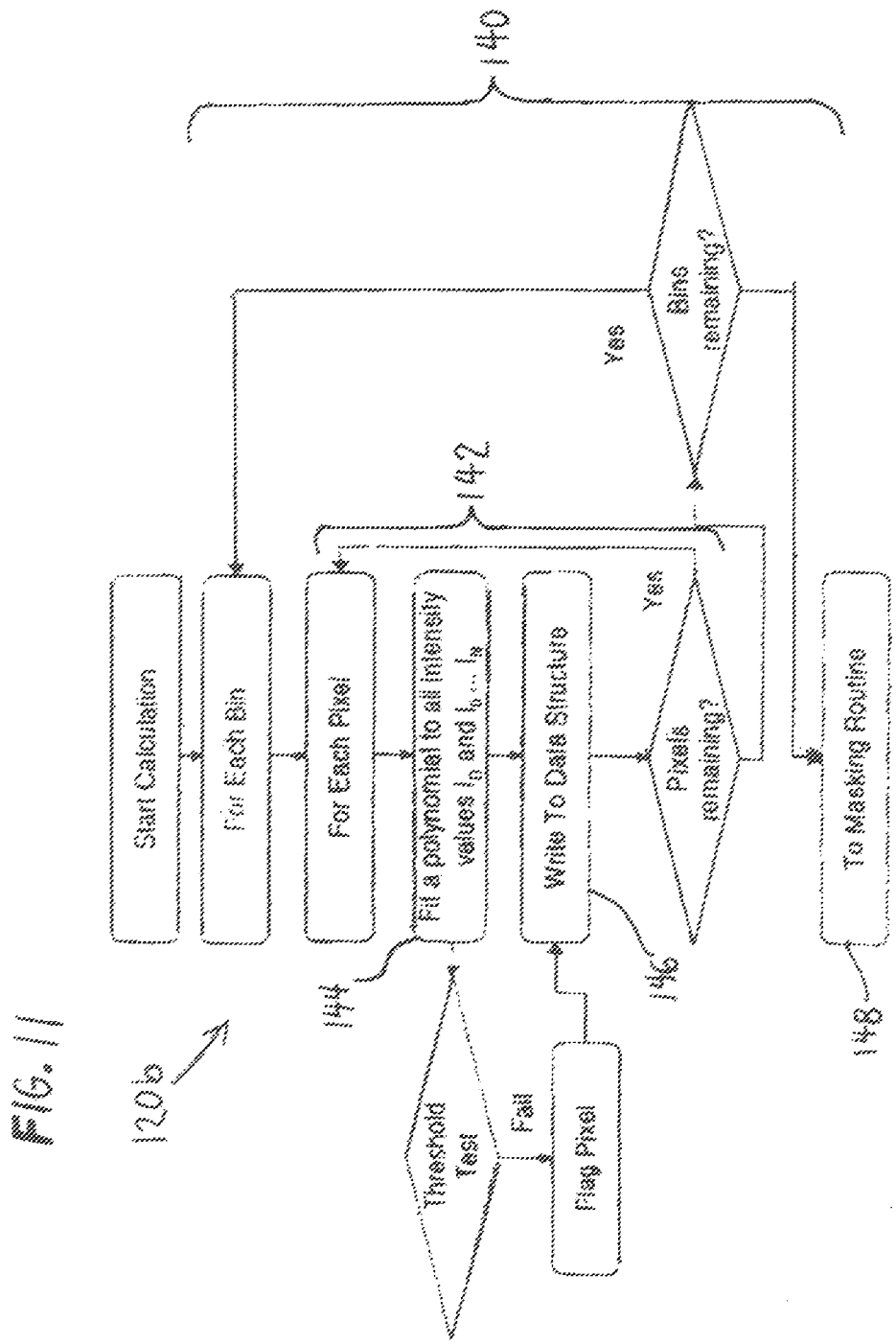
FIG. 11 is a block flow diagram illustrating a strategy for calculating correction coefficients for each image pixel in a pixel frame.
Figure 12:
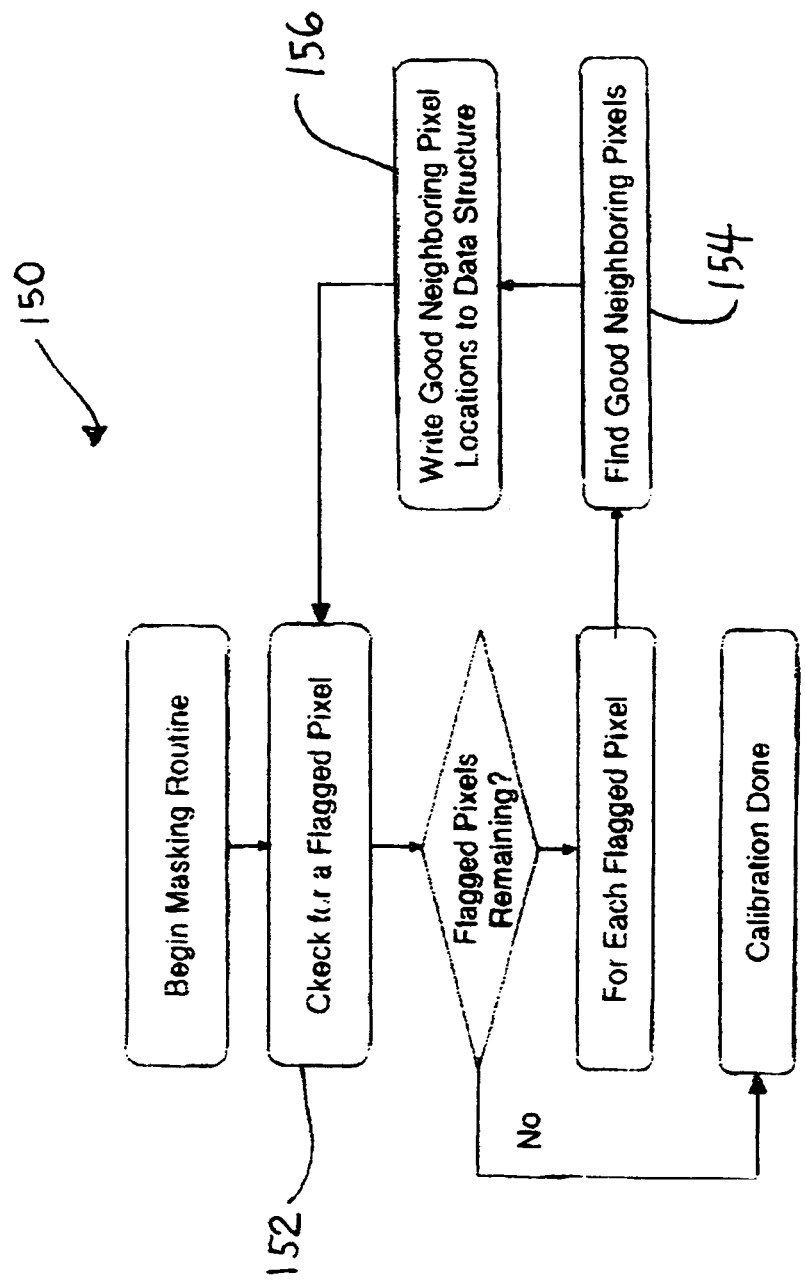
FIG. 12 is a block flow diagram illustrating a strategy for detecting and compensating for bad or uncorrectable pixels.

Referring now to FIGS. 10 to 12, the calibration procedure 49 is described in still further detail. In FIG. 10, the data collection cycle submethod 120a is described. In a first step 122, the Data Bins are initialized, such bins having a structure as follows:

Bin 1: Time 0 . . . T$_1$
Bin 2: Time T$_1$ . . . T$_2$
Bin N: Time T$_{N-1}$ . . . T$_N$.

In a second step 124, the radiation field intensity is set. In a third step 126, high voltage is pulsed. In a fourth step 130, the timer is reset. In a fifth step 132, the collect time is set to equal the time of the image frame, T$_{IF}$, and a loop, which continues as long as the cycle is still active, the data bin B is found and the frame 44 is added to the bin. Then, in a seventh step 134, if there are more repetitions to be performed, in order to reduce noise, for example, the loop is run again.

In FIG. 11, the submethod 120b for calculation of correction coefficients includes the following steps. In a loop 140 over each bin and, within that loop, a loop 142 over each pixel 36, in a first step 144, a polynomial is fit to all intensity values 1.sub.D and 1.sub.O . . . 1.sub.N and, if the pixel fails a threshold test, the pixel 36 is flagged. In a second step 146, the data structure (look up table), is written to. In a third step 148, the submethod 120b continues to a masking routine 150.

In FIG. 12, the masking submethod 150 includes the following steps. In a first step 152, the submethod 150 checks for flagged pixels 36. For each flagged pixel 36, in a second step 154, the submethod 150 finds good neighboring pixels 36. In a third step 156, the good neighboring pixel locations are written to the data structure 20. When there are no flagged pixels 36 remaining, the submethod 150 ends.

In FIG. 13, the normalization procedure 160 is described, including the following steps, performed on the raw image pixel data from the frame processor module. In a first step 162, during operation of the system 10, the image frame 44 is received and time stamp is set to "T". In a second step 164, the bin is found for time "T". In a third step 166, looping over each pixel 36, the pixel is checked to see if it's flagged or bad. If yes, then, in a fourth step 168, the pixel value 47 is replaced with a weighted mean value of good neighbors. In a fourth step 170, any correction polynomials are applied.

The raw image pixel data from the frame processor module The calibration process uses a software driven calibration module 20 to create and maintain a "look-up table" resident in a data structure module 22. The look-up table is a set of time dependent, image pixel specific correction coefficients 54 for each pixel of an image frame. The pixel specific correction values 54 are referenced to a target uniform intensity value 52 (see FIG. 5), and are used to correct the raw value of the specific image pixel to a normalized value. Therefore, each image pixel represented in an image frame has a data set of time dependent correction coefficients in the look-up table of the data structure module 22 generated for each of a number of reference x-ray field intensities.

The time dependency of a set of correction coefficients/values derives from the application of a time-stamp to each image frame processed by the high speed frame module. The time-stamp indicates the time elapsed since the start of the data collection cycle Ct that the image frame 44 was generated. In the preferred embodiment illustrated in FIG. 5, the image frames 44 that are time-stamped were captured (grabbed) from the camera module 12 at uniform frame intervals 46 in the data collection cycle Ct. Therefore, the image frames 44 that are time-stamped always had the same time difference relative to each other. The first frame grabbed after detector bias voltage was switched on was assigned time-stamp=0, second had time-stamp=1, and so on up to time-stamp=N. In practice, a separate calibration data set was calculated for each image pixel and included a correction value for that specific image pixel at each time-stamp in the data collection cycle Ct. Alternatively, the calibration data can be thought of or organized as consisting of N different calibration data sets, one for each image frame of the data collection cycle Ct, each frame data set comprising a separate correction value/coefficient for each image pixel in the frame. For best image quality, N should be selected as the highest number of different time stamps possible N$_{max}$ or in other words, the highest frame rate possible. However, this would be an extremely data intensive condition and due to current limitations in the technology, e.g., limited computer memory processing times, an N<N$_{max}$ has to be selected.

Referring now to FIG. 6 is a graph 186 illustrates normalization of the intensity value of an image pixel 47 by the application of a specific time dependent correction coefficient to the raw intensity value of the particular image pixel s output in each image frame 44.

Collecting the Data. First step in the calibration method is to collect the relevant data, specifically, the response of the camera's imaging device 28 to different reference radiation field intensities. The response of each pixel cell 29 of the device 28 is collected for all the time-stamps in the data collection cycle Ct. In the preferred embodiment illustrated, this step was repeated for one or more times (generally 20 or more), to reduce the effect of incoming quantum noise. Collecting the relevant data this way corrects for any non-uniformities in the detector or ASIC components, but also intrinsically provides "flat-field" correction. In this embodiment, the calibration method tied the imaging device 28 of the camera module 12 to a specific geometric relationship with the radiation source. Which is to say that calibration had to be redone whenever the radiation source or the geometry between the imaging device 28 and the radiation source was changed. Also, calibration should was repeated for each radiation spectrum used.

Calculation of Pixel Specific Correction Coefficients/Values. The response of a single pixel cell 29 as a function of time and with exposure to different reference radiation field intensities has a characteristic shape. The basic idea behind the present calibration method is uniformity. Each and every pixel cell 29 should give the same pixel output signal if exposed to the same intensity of radiation. This means that the calibration function $$y_{out}=f_{pix}(x_{in}) \quad (1)$$

is a mapping from pixel output values $x_{in}$ to global output values $y_{out}$. The task is to find suitable functions $f_{pix}()$ for each pixel that gives the same output as all the other pixels.

The choice to use polynomials was made because they are extremely fast to calculate, which was absolutely necessary for real-time operation. The polynomials are not the best basis for regression problems like this, because of their unexpected interpolation and extrapolation behavior. The function $f_{pix}()$ can now be explicitly written as:

$$y_{out} = \sum_{i=0}^{M} a_{i,pix} x_{in}^i \quad (2)$$

where $a_{i,pix}$ are the coefficients for pixel pix and M is the order of the polynomial. The commonly used linear calibration (gain and offset correction) is a special case when M=1. Use of up to 3$^{rd}$ order polynomial was the basis of the current embodiment, but linear correction might be sufficient if a large enough number of time-dependent coefficient datasets is used.

Estimating Calibration Parameters. A common way of estimating model parameters in a regression problem like this is to use a Maximum Likelihood (ML) estimation. This means that we maximize the likelihood of all the data points for a one pixel at a time given the function and noise model. Assuming normally distributed zero-mean noise, the probability of one data sample $x_1$ is:

$$p(x_i | \sigma, f) = \frac{1}{\sqrt{2\pi}\,\sigma^2} \text{Exp}\left(\frac{(x - f(x))}{2\sigma^2}\right) \quad (3)$$

and the total likelihood for all the samples assuming they are statistically independent is:

$$LL = \prod_{i=1}^{N_{data}} p(x_i | \sigma, f) = \left(\frac{1}{\sqrt{2\pi}\,\sigma^2}\right)^{N_{data}} \text{Exp}\left(-\sum_{i=1}^{N_{data}} \frac{(x - f(x))}{2\sigma^2}\right) \quad (4)$$

A problem with Maximum Likelihood estimation is that it is very difficult to apply any prior knowledge accurately. To overcome this, a Maximum A Posteriori (MAP) estimation is used. In a MAP estimation, the posteriori distribution of all the samples is maximized by:

$$p(\Lambda, f | x) = \frac{p(x | \Lambda, f) p(f)}{p(x)} \quad (5)$$

where $\Lambda$ is the estimated covariance matrix of samples assuming independence, $\Lambda = \text{diag}[\sigma_1 \ldots \sigma_{Ndata}]$, $x = [x_1 \ldots x_{Ndata}]$ is the vector of data samples and $f = [f(x_1) \ldots f(x_{Ndata})]$ is the vector of calibrated values for this pixel. $p(x)$ is the uninteresting scaling factor, evidence. If we assume normal distribution for noise and for function parameter prior $$p(x | \Lambda, f) = (2\pi)^{-\frac{N_{data}}{2}} |\Lambda|^{-\frac{1}{2}} \exp\left(-\frac{1}{2} x^T \Lambda^{-1} x\right) \quad (6)$$

$$p(f) = (2\pi)^{-\frac{M+1}{2}} \sigma_{prior}^2 \exp\left(-\frac{1}{2\sigma_{prior}^2} \sum_{i=0}^{M} a_i^2\right) \quad (7)$$

then the final posteriori will have form of:

$$p(\Lambda, f | x) = \frac{(2\pi)^{-\frac{N_{data}}{2}} |\Lambda|^{-\frac{1}{2}} \exp\left(-\frac{1}{2} x^T \Lambda^{-1} x\right) \cdot (2\pi)^{-\frac{M+1}{2}} \sigma_{prior}^2 \exp\left(-\frac{1}{2\sigma_{prior}^2} \sum_{i=0}^{M} a_i^2\right)}{p(x)} \quad (8)$$

If we take the natural logarithm of the formula above and group all the constant coefficients to new ones, we will get a cost function of:

$$\text{Cost} = \sum_{i=1}^{N_{data}} \frac{1}{\sigma_i^2} (x_i - f(x_i))^2 + \sigma_{prior}^2 \sum_{i=0}^{M} a_i^2 \quad (9)$$

which can be interpreted as a weighted and constrained linear least squares cost function with penalty parameter of $\sigma_{prior}^2$. The final parameter values can be solved by differentiating the equation above with respect to all the function parameters $a_1$ and then setting the derivative equal to zero. The motivation for using weighted least squares is that when using different X-ray intensities, the quantum noise for the highest intensity is much higher than for example the dark current. This allows more weight to be given to smaller values, which are probably more accurate.

Implementation and Performance Considerations. To optimize image quality, 32-bit floating-point arithmetic was used in all the calculations. Current x86 processors offer good SIMD (single instruction, multiple data) command that allowed very efficient parallel processing.

Selecting Appropriate Time-Stamped Calibration Image Frames for Use in the Correction Protocol. For practical reasons, every time-stamp in the data collection cycle Ct cannot be used because the amount of data generated would be huge, and processing time and memory allocations prohibitive in certain circumstances. This is because current large-area cameras offer images up to 508×512 pixels. There are up to 4 parameters per pixel (if $3^{rd}$ order polynomial is used) and each parameter is 4 bytes. This means there are 3.97 MB of data collected per frame. In the current embodiment, the camera provided 50 frames per second, which meant a data collection rate of 198 MB/second. In addition to this, the images were read over the PCI bus in 16-bit format (24.8 MB/second) and stored in the memory (another 24.8 MB/second). So the total data rate for 50 fps operation was 248 MB/second. In frame averaging mode, the previous image values were also read from the memory, which gave another 24.8 MB/second, and a total of 273 MB/second memory bandwidth. If the images are displayed on a screen, the 16-bit pixel values is read from the memory, a 32-bit color value is read from the lookup-table per pixel and the final 32-bit values is stored in the display memory giving additional 124 MB/second for a grand total of 397 MB/second. And the field is moving to even larger cameras.

If a first order model is used, one pixel requires at least two 32-bit floating point numbers/frame. For a data collection cycle time of 30 second, at a frame rate of 300 fps and a 96000 pixel image frame would mean 6.4 GB of data generated over a single data collection cycle. FIGS. 12A to 12C are a further illustration of this. FIG. 14a shows the prior art method of error sampling, known as Uniform Sampling, at 300 fps, 30 sec cycle, 100,000 pixels, 4 parameters, 4 bytes/parameter, where we have a $3^{rd}$ Order polynomial for signal and a $0^{th}$ order for time. However, at 300 fps with a 30 sec data collection cycle and a 100,000 pixel camera, and 4 parameters at 4 bytes/parameter, 13 GB of data must be collected and processed. This is impractical. FIG. 14b shows a present non-uniform method of error sampling, $0^{th}$ order interpolation, 300 data sets, 4 parameters, which under camera operating perimeters similar to FIG. 14a only generated about 480 MB of data to be collected and processed. This is a reduction in storage and processing requirements by a factor of 30 over the prior art. Note that there are artifacts in the beginning and at the end of the cycle. FIG. 14c. illustrates a preferred non-uniform error sampling method using linear interpolation, for 10 data sets, 4 parameters. Under camera operating parameters similar to FIG. 14a, this method only generated about 16 MB of data to be collected and processed. This is a reduction in storage and processing requirements by a factor of 30 over the prior art method of FIG. 14a. Note that there are small artifacts in the beginning and at the end of the cycle. Bilinear correction was linear for signal and linear for time. Linear interpolation in time reduces apparent signal non-linearity and thus linear correction for signal is adequate.

As shown in FIGS. 7 and 14c, a selection can be made to utilize an optimized subset image frames, which the present calibration does. At the beginning of the data collection cycle Ct, the changes in a pixel cell's circuit output signal over time 40 are more drastic. Because of this greater variability, the calibration data sets should include more relatively reference frames from this portion of the collection cycle Ct than towards the end of the collection cycle Ct where the output signal over time 40 can be relatively flatter. In a preferred embodiment, an automatic method was used to allow the user to change exposure time (i.e. frame rate) and/or the off-time of the detector bias voltage 50, but the settings can be accomplished manually as well. Note that in the graph shown, one bar represents one set of calibration values.

How to Select Which Pixels to Mask. Some of the pixels cells 29 in an imaging device 28 are practically useless because of material and manufacturing defects. Therefore, these pixels cells 29 have to be identified and masked out, i.e., each of their outputs replaced with some reasonable value calculated from the neighboring pixel cells 29. The present calibration method calculates a local average value of a set of neighboring pixel cell output signals and then compares this value to individual pixel output signal values. This allows the calibration method to adapt to a non-stationary radiation field. A preferred embodiment, calculated an average frame at least 5 complete data collection cycles at a single reference radiation field intensity setting. This provided a very robust and dependable determination in minimal time of the bad pixels cells 29 in an imaging device 28.

Calculating Replacement Values. After all the bad pixel cells 29 have been located, their values are replaced with their local arithmetic averages. There for the output signal of a solitary bad pixel cell 29 is replaced with the average of four good adjacent pixel output signals. The pixel output signal from the bad pixel cell 29 is excluded in this calculation. The four good adjacent pixel cells 29 were selected so that all the possible directions were equally weighted. For example, if the pixel cell 29 above a first bad pixel cell 29 is also a bad, then either the pixel cell 29 to up-left or up-right is used instead in calculating the replacement value for the pixel output signal of the first bad pixel cell 29.

Geometry Correction and Filling-in Inactive Zones. The relative positions on the ASIC hybrids are ideally close and uniform, which means that there are some inactive areas (dead space) between adjacent hybrids and that the relative distances can vary between different adjacent hybrid. The solution to this problem is two-step. First measurements were made of the distances between hybrids and possible rotation angles of hybrids based on a calibration image of a reference object. Then, the errors were corrected based on these measurements. The measurements were made by using the camera itself as a measuring device, and taking images with a calibrated reference object that has very accurate dimensions. Then after measuring the distances, the known and measured values were compared and the mismatches detected.

Correction for Mismatches and Filling. After the exact positioning of the hybrids was known, a correction algorithm was implemented. Based on the distances a grid was constructed which showed exactly where a given pixel should lie in the image. Based on this, a bilinear interpolation (or any other interpolation method) method was used to get the sub-pixel translated and rotated new pixel values.

Multiple variations and modifications are possible in the embodiments of the invention described here. Although certain illustrative embodiments of the invention have been shown and described here, a wide range of modifications, changes, and substitutions is contemplated in the foregoing disclosure. In some instances, some features of the present invention may be employed without a corresponding use of the other features. Accordingly, it is appropriate that the foregoing description be construed broadly and understood as being given by way of illustration and example only, the spirit and scope of the invention being limited only by the appended claims.

What is claimed is:

1. An x-ray imaging device (28), comprising:
a camera radiation detector substrate comprised of an array of pixels,
each pixel collecting electrical charges generated responsive to absorption of radiation energy,
the collected electrical charges defining an uncorrected image pixel value of the corresponding pixel;
an output for producing multiple different image frames (44), each frame comprising an array (45) of the uncorrected image pixel values from the detector substrate;
a correction part (20, 49, 22, 24) for individually applying an individualized, pixel-specific calibration correction function to each of the uncorrected image pixel values of the output, including offset correction, for correcting the uncorrected image pixel values from each frame of the different image frames to provide a normalized image data to a display for presenting an x-ray image,
the calibration correction function being specific to each of the uncorrected image pixel values of the output of each frame; and
a processor (24) for calculating the individualized specific correction function for each of the uncorrected image pixel values of each frame, the specific calibration correction for each image pixel value (47) of said normalized image data being derived from a plurality of corrected individual single frame image pixel values (36) of said multiple different frames corrected by said specific correction functions.

2. The device (28) of claim 1, wherein,
said correction part utilizes incoming intensity of the absorbed radiation energy to normalize the individual pixels with respect to one another, and
the calibration correction function for each uncorrected image pixel value is independent of the calibration correction functions for at least some of the other image pixel values of the output of each frame.

3. The device (28) of claim 1, wherein,
the calibration correction function utilizes different pixel-specific polynomial functions for each of different pixels, each respective calibration correction function providing a pixel specific correction coefficient independent of the calibration correction coefficient for other image pixel values of the output of each frame.

4. The device (28) of claim 1, wherein,
the uncorrected image pixel value of each pixel indicates an intensity of the radiation energy absorbed on the associated pixel, the calibration correction function utilizes different pixel-specific polynomial functions for each of different pixels, each respective calibration correction function providing a pixel specific correction coefficient independent of the calibration correction coefficients for other image pixel values of the output of each frame, each of the different pixel-specific polynomial functions provides a mapping from the uncorrected image pixel value ($x_{in}$) to a global output value so each pixel gives the same output as all the other pixels for the same intensity of the absorbed radiation energy, the polynomial function of each pixel being:

$$y_{out} = \sum_{i=0}^{M} a_{i,pix} x_{in}^{j}$$

wherein $a_{i,pix}$ are the coefficients for each pixel pix, M is the order of the polynomial, and $x_{in}^{i}$ are the uncorrected image pixel values for each pixel.

5. The device (28) of claim 1, wherein,
the camera radiation detector substrate is a high pixel density, direct conversion radiation detector substrate (30), and further comprising:
a high energy x-ray imaging camera (37),
the camera including a camera module (12) having the high pixel density, direct conversion radiation detector substrate (30), with the pixels (36) of the detector substrate in electrical connection to a corresponding pixel circuit (31) on an ASIC readout substrate (32),
the detector substrate providing for directly converting impinging high energy x-ray and gamma ray radiation (80) to an electrical charge and communicating the collected electrical charge via an electrical connection (35) between the pixel (36) to a corresponding pixel circuit on the ASIC readout substrate (32) as an electric charge signal of the uncorrected image pixel value, and the pixel circuit providing for processing the electric charge signal of the uncorrected image pixel value from each pixel.

6. The device (28) of claim 5, wherein the camera includes a detector substrate bias switch circuit (121).

7. The device (28) of claim 5, wherein the camera comprises a Cadmium Telluride composition based radiation detector substrate (30) in communication with the ASIC readout substrate (32).

8. The device (28) of claim 7, wherein the camera comprises the radiation detector substrate (30) being a composition selected from the group consisting of: Cadmium-Telluride and Cadmium-Zinc-Telluride.

9. The device (28) of claim 5, further comprising a high speed image frame processing module (18) in electronic communication with the ASIC readout substrate (32) of the imaging camera (37), the frame processing module capable of receiving digitized pixel signals derived from the output from each pixel circuit (31) of the readout substrate and using the pixel signals to generate an image frame (44) at a frame readout rate of greater than ten image frames per second.

10. The device (28) of claim 9, wherein the high speed image frame processing module (18) is capable of receiving digitized pixel signals derived from the output of each pixel circuit (31) of the readout substrate (32) and using the digitized pixel signals to generate an image frame (44) at a frame readout rate of greater than 25 image frames per second.

11. The device (28) of claim 9, wherein the high speed image frame processing module (18) is capable of receiving digitized pixel signals derived from the output from each pixel circuit (31) of the readout substrate (32) and using the digitized pixel signals to generate an image frame (44) at a frame readout rate of greater than 50 image frames per second.

12. The device (28) of claim 9, further comprising a calibration module selectably in digital communication with the frame processor module (18), the calibration module when selected being driven by a software process including a calibration routine (20) which calibration routine writes pixel correction data specific to each pixel (36) in an image frame (44) to a lookup table (22).

13. The device (28) of claim 12, wherein the software process includes a calibration routine (20) which analyzes each of the digitized pixel values (47) over at least some of the collected calibration frames (44) being analyzed in accordance with a pixel value correction algorithm (49) to provide and write pixel value correction data specific to each pixel (36) in an image frame (44) to the lookup table (22).

14. The device (28) of claim 12, wherein the software driving the calibration module (20) includes a pixel non-linear performance compensation routine (123) providing error correction for each pixel (36) as a function of time.

15. The device (28) of claim 14, wherein the pixel non-linear performance compensation routine (123) includes an asymmetric linear polynomial calculation to determine correction coefficients to provide error correction for each pixel (36) as a function of time.

16. The device (28) of claim 12, wherein the lookup table is writeable by the calibration module (20) with pixel specific correction data, and readable by a normalization module (24).

17. The device (28) of claim 16, wherein the normalization module (24) is selectably in communication with the frame processor module (18) and with the lookup table (22), the normalization module receiving real time image frame data/record from the frame processor module and pixel specific correction data from the lookup table, and providing said normalized image data via a display image output for use in said display module (16) to present said X-ray image.

18. The device (28) of claim 17, wherein the normalization module (24) provides said normalized image data via said display image output for use in said display module (16) to present a dynamic X-ray image from the high energy, real time, direct detection X-ray imaging system (10).

19. The device (28) of claim 18, wherein the normalization module (24) accumulates said normalized image data over a period of time of at least one hundredth of a second to ten seconds for providing a high precision display image output for each of the accumulation periods, for use in said display module (16) to present said dynamic X-ray image.

20. The device (28) of claim 17, wherein the normalization module (24) provides said normalized image data via said display image output for use in said display module (16) to present a static X-ray image from the high energy, real time, direct detection X-ray imaging system (10).

21. The device (28) of claim 20, wherein the normalization module (24) accumulates said normalized image data over a period of time to provide a high precision display image output for use in said display module (16) to present said static X-ray image.

22. The device (28) of claim 21, wherein the normalization module (24) accumulates said normalized image data over a period of time of at least one hundredth of a second to 300 seconds.

23. The device (28) of claim 9, wherein the normalization module (24) accumulates said normalized image data over a period of time of at least five minutes.

* * * * *